(12) United States Patent
Zhang et al.

(10) Patent No.: US 12,315,595 B2
(45) Date of Patent: May 27, 2025

(54) WRITE LEVELING CIRCUIT APPLIED TO MEMORY, AND METHOD AND APPARATUS FOR CONTROLLING THE SAME

(71) Applicant: CHANGXIN MEMORY TECHNOLOGIES, INC., Hefei (CN)

(72) Inventors: Zhiqiang Zhang, Hefei (CN); Yuling Tang, Hefei (CN)

( * ) Notice: Subject to any disclaimer, the term of this patent is extended or adjusted under 35 U.S.C. 154(b) by 189 days.

(21) Appl. No.: 18/450,682

(22) Filed: Aug. 16, 2023

(65) Prior Publication Data
US 2024/0062793 A1 Feb. 22, 2024

Related U.S. Application Data

(63) Continuation of application No. PCT/CN2022/132673, filed on Nov. 17, 2022.

(30) Foreign Application Priority Data

Aug. 16, 2022 (CN) .......................... 202210982417.7

(51) Int. Cl.
*G11C 7/22* (2006.01)
*G11C 7/10* (2006.01)
*G11C 8/18* (2006.01)

(52) U.S. Cl.
CPC ............ *G11C 7/222* (2013.01); *G11C 7/1096* (2013.01); *G11C 8/18* (2013.01)

(58) Field of Classification Search
CPC .................................. G11C 7/222; G11C 7/22
(Continued)

(56) References Cited

U.S. PATENT DOCUMENTS 8,867,302 B2 10/2014 Kwon
9,070,429 B2 6/2015 Kwon
(Continued)

FOREIGN PATENT DOCUMENTS

CN 102610268 A 7/2012
CN 208208341 U 12/2018
(Continued)

OTHER PUBLICATIONS

Kim Dongkyun et al: "23.2 A 1.1 V 1ynm 6.4Gb/s/pin 16Gb DDR5 SDRAM with a Phase-Rotator-Based DLL, High-Speed SerDes and RX/TX Equalization Scheme", 2019 IEEE International Solid-State Circuits Conference—(ISSCC), IEEE, Feb. 17, 2019, pp. 380-382.*
Kim Dongkyun et al: "A 1.1-v 10-nm Class 6.4Gb/s/Pin 16-Gb DDR5 SDRAM with a Phase Rotator-ILO DLL, High-Speed SerDes, and DFE/FFE Equalization Scheme for Rx/Tx", IEEE Journal of Solid-State Circuits, IEEE, USA, vol. 55, No. 1, Jan. 1, 2010, pp. 167-177.*
(Continued)

*Primary Examiner* — Muna A Techane
(74) *Attorney, Agent, or Firm* — Syncoda LLC; Feng Ma

(57) ABSTRACT

A write leveling circuit applied to a memory includes: a write signal generation circuit configured to perform delay processing on a first write signal according to a received first clock signal, and output a second write signal; a delay circuit configured to perform delay processing on a received first data strobe signal, and output a second data strobe signal; and a sampling circuit connected to both the delay circuit and the write signal generation circuit, and configured to output a first sampling signal according to the received second data strobe signal and the received second write signal. The sampling circuit is further configured to receive the first data strobe signal, and output a second sampling signal according to the first data strobe signal and the second write signal.

20 Claims, 10 Drawing Sheets

(58) Field of Classification Search
USPC ...................................................... 365/233.1
See application file for complete search history.

(56) References Cited

U.S. PATENT DOCUMENTS

| | | | |
|---|---|---|---|
| 9,911,478 B1* | 3/2018 | Peddu | G11C 7/22 |
| 10,468,080 B1* | 11/2019 | Yun | G11C 29/023 |
| 2007/0291830 A1 | 12/2007 | Hori | |
| 2010/0312925 A1 | 12/2010 | Osanai et al. | |
| 2011/0047319 A1* | 2/2011 | Jeon | G06F 13/4243 |
| | | | 711/E12.001 |
| 2012/0113728 A1 | 5/2012 | Kwon | |
| 2015/0016196 A1 | 1/2015 | Kwon | |
| 2016/0162404 A1* | 6/2016 | Lee | G11C 7/1093 |
| | | | 711/120 |
| 2019/0348094 A1* | 11/2019 | Park | G06F 3/0634 |
| 2022/0013156 A1 | 1/2022 | Penney | |

FOREIGN PATENT DOCUMENTS

| | | |
|---|---|---|
| CN | 208954638 U | 6/2019 |
| CN | 113615088 A | 11/2021 |

OTHER PUBLICATIONS

Extended European Search Report in application No. 22940936, mailed on Oct. 10, 2024.

Kim Dongkyun et al: "23.2 A 1.1 V 1ynm 6.4Gb/s/pin 16Gb DDR5 SDRAM with a Phase-Rotator-Based DLL, High-Speed SerDes and RX/TX Equalization Scheme", 2019 IEEE International Solid-State Circuits Conference—(ISSCC), IEEE, Feb. 17, 2019, pp. 380-382, XP033527832.

Kim Dongkyun et al: "A 1.1-v 10-nm Class 6.4Gb/s/Pin 16-GB DDR5 SDRAM with a Phase Rotator-ILO DLL, High-Speed SerDes, and DFE/FFE Equalization Scheme for Rx/Tx", IEEE Journal of Solid-State Circuits, IEEE, USA, vol. 55, No. 1, Jan. 1, 2020, pp. 167-177, XP011763169.

International Search Report in the international application No. PCT/CN2022/132673, mailed on Apr. 17, 2023. 8 pages with English translation.

JP first office action in application No. 1-2023-572041, mailed on Jan. 7, 2025.

TW first office action in application No. 112102400, issued on May 3, 2024.

* cited by examiner

WRITE LEVELING CIRCUIT APPLIED TO MEMORY, AND METHOD AND APPARATUS FOR CONTROLLING THE SAME

CROSS-REFERENCE TO RELATED APPLICATIONS

This is a continuation of International Patent Application No. PCT/CN2022/132673 filed on Nov. 17, 2022, which claims priority to Chinese Patent Application No. 202210982417.7 filed on Aug. 16, 2022. The disclosures of the above-referenced applications are hereby incorporated by reference in their entirety.

BACKGROUND

Currently, memories play a very important role in various electronic devices. When data is written into a memory, a data strobe signal (DQS) is usually used to determine which cycle of a clock signal to write the data in. When routings between dynamic random memories (DRAM) in an electronic device and a controller for a memory use a fly-by topology, there will be a deviation between a clock signal and a data strobe signal received by each DRAM in the electronic device, and therefore, the received data strobe signals of the memories need to be adjusted so that data can be written into the memories correctly.

How to design a write leveling circuit to facilitate an adjustment of data strobe signals received by memories by controlling the write leveling circuit is a problem that urgently needs to be solved.

SUMMARY

The present disclosure relates to the technical field of memories, and particularly relates to a write leveling circuit applied to a memory, and a method and an apparatus for controlling the same.

The present disclosure provides a write leveling circuit applied to a memory, and a method and an apparatus for controlling the same.

In a first aspect, the present disclosure provides a write leveling circuit applied to a memory. The write leveling circuit includes a write signal generation circuit, a delay circuit and a sampling circuit:

The write signal generation circuit is configured to perform delay processing on a first write signal according to a received first clock signal, and output a second write signal.

The delay circuit is configured to perform delay processing on a received first data strobe signal, and output a second data strobe signal.

The sampling circuit is connected to both the delay circuit and the write signal generation circuit, and configured to receive the second data strobe signal output by the delay circuit and the second write signal output by the write signal generation circuit, and output a first sampling signal according to the second data strobe signal and the second write signal. The sampling circuit is further configured to receive the first data strobe signal and the second write signal output by the write signal generation circuit, and output a second sampling signal according to the first data strobe signal and the second write signal.

In a second aspect, the present disclosure provides a method for controlling a write leveling circuit applied to a memory, the method is applied to the circuit of claim 1, and includes the following operations:

repeating the following operations until it is determined, based on a first sampling signal output by a sampling circuit, that an active edge of a first data strobe signal is aligned with that of a first clock signal: if it is determined that the first sampling signal indicates that the active edge of the first clock signal is misaligned with that of the first data strobe signal, adjusting a delay of the first data strobe signal;

if it is determined that the first sampling signal indicates that the active edge of the first clock signal is aligned with that of the first data strobe signal, controlling a delay of the first data strobe signal to be reduced by a first preset period, and using a signal with the reduced delay as a first data strobe signal currently received by the sampling circuit; and repeating the following operations until it is determined, based on a second sampling signal output by the sampling circuit, that the active edge of the first data strobe signal is aligned with that of a second write signal: if it is determined that the second sampling signal indicates that the active edge of the first data strobe signal is misaligned with that of the second write signal, adjusting the delay of the first data strobe signal or a delay of the first write signal.

In a third aspect, the present disclosure provides an apparatus for controlling a write leveling circuit applied to a memory, which includes a processor and a memory in communication connection with the processor.

The memory is configured to store computer-executable instructions.

The processor is configured to execute the computer-executable instructions stored in the memory to implement the method according to any one of the items in the second aspect.

In a fourth aspect, the present disclosure provides a memory, which includes the write leveling circuit according to any one of the items in the first aspect.

The present disclosure provides a write leveling circuit applied to a memory, and a method and an apparatus for controlling the same. The write leveling circuit includes: a write signal generation circuit configured to perform delay processing on a first write signal according to a received first clock signal, and output a second write signal; a delay circuit configured to perform delay processing on a received first data strobe signal, and output a second data strobe signal; and a sampling circuit connected to both the delay circuit and the write signal generation circuit and configured to receive the second data strobe signal output by the delay circuit and the second write signal output by the write signal generation circuit, and output a first sampling signal according to the second data strobe signal and the second write signal; the sampling circuit is further configured to receive the first data strobe signal and the second write signal output by the write signal generation circuit, and output a second sampling signal according to the first data strobe signal and the second write signal. In this way, a corresponding controller outside a memory can adjust, by means of the first sampling signal and the second sampling signal output by the sampling circuit in the write leveling circuit, signals sent to the memory by the controller, such that the time difference between an active edge of a data strobe signal received by the memory and an active edge of a clock signal satisfies specification requirements of the memory, thereby enabling data to be written into the memory correctly.

DESCRIPTION OF REFERENCE NUMERALS

Figure 1:
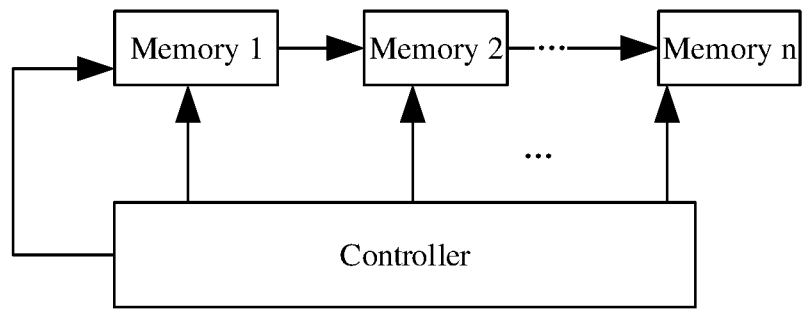
FIG. 1 is a schematic diagram of a routing layout of a memory according to the present disclosure.

21: write signal generation circuit; 211: decoder; 212: first delay circuit; 213: signal conversion circuit; 214: second delay circuit; 22: delay circuit; 23: sampling circuit; 231: first flip-flop; 232: second flip-flop; 233: multiplexer; 24: first converter; 25: second converter; 26: third converter; 27: high-level delay circuit; 28: high-level sampling circuit; 281: third flip-flop; 282: fourth flip-flop; 283: high-level multiplexer.

DETAILED DESCRIPTION

Exemplary embodiments will be described in detail herein, and examples thereof are shown in the drawings. When the following description refers to the drawings, the same numerals in different drawings refer to the same or similar elements unless otherwise indicated. The implementations described in the following exemplary embodiments are not representative of all implementations consistent with the present disclosure. Instead, they are merely examples of apparatuses and methods consistent with some aspects of the present disclosure.

Currently, for an electronic device, in order to reduce a routing between a dynamic random access memory (DRAM) in the electronic device and a controller for a memory, when a plurality of DRAMs are included in the electronic device, a fly-by routing topology is typically used. As shown in FIG. 1, which is a schematic diagram of a routing layout of a memory according to the present disclosure, a clock signal output port of a controller corresponding to respective DRAMs is connected to the first DRAM in a plurality of DRAMs connected in series to transmit a clock signal to the first DRAM. The clock signal received by each of the remaining DRAMs in the plurality of DRAMs connected in series is output by the previous DRAM connected in series therewith. Further, a data terminal of each of the plurality of DRAMs is respectively connected to the controller directly and configured to receive a data strobe signal sent by the controller, and respective routings between the DRAMs and the controller to transmit data strobe signals have the same length.

When the routing topology above is used to connect a controller and a plurality of DRAMs, the time for a data strobe signal to reach each of the DRAMs is the same, but the time for the DRAMs to receive a clock signal will vary, and the deviation between the time to receive the clock signal and the time to receive the data strobe signal is different for each DRAM. Therefore, the delay of a received DQS signal needs to be adjusted continually for each DRAM, such that the time difference between an active edge of the received DQS signal on each DRAM and an active edge of the clock signal satisfies specification requirements of the memory. For example, when the time difference is in [−0.5 tck, 0.5 tck], it may be considered that a DQS signal sent by the controller at this time satisfies specification requirements of the DRAM to ensure that data can be written into the DRAM correctly, where tck is used to indicate a clock cycle of a clock signal.

In one example, to ensure that an active edge of a data strobe signal received by a memory is aligned with that of a clock signal, a write leveling circuit may be disposed in the memory. A first receiver and a second receiver are provided in the write leveling circuit, and are configured to receive a clock signal and a data strobe signal input into pins of the memory, respectively. In addition, a delay circuit is further provided behind the first receiver, and configured to perform delay processing on the data strobe signal output by the first receiver and then to output the signal that has undergone the delay processing to one end of a flip-flop. The write leveling circuit further includes a write signal generation circuit. The write signal generation circuit is configured to generate a write signal based on the clock signal output by the second receiver and output the generated write signal to the other end of the flip-flop, so that the flip-flop can compare whether an active edge of the write signal received by the flip-flop and output by the write signal generation circuit is aligned with that of the delayed signal output by the delay circuit, thereby determining whether the active edge of the clock signal received by the memory is aligned with that of the data strobe signal.

When a signal (e.g., a data strobe signal, a write signal) has a large delay during transmission in the memory, power consumption and signal jitters caused by signal transmission in the memory will increase as the read-and-write rate of the memory continuously increases.

Therefore, how to design a novel write leveling circuit to facilitate an adjustment of data strobe signals received by a memory by controlling the write leveling circuit is a problem that urgently needs to be solved.

A write leveling circuit applied to a memory, and a method and an apparatus for controlling the same provided by the present disclosure are intended to solve the above technical problems in some implementations.

The following are specific embodiments to explain in detail the technical solutions of the present disclosure and how to solve the above technical problems by using the technical solutions of the present disclosure. The several specific embodiments below may be combined with each other, and the same or similar concepts or processes may not be repeated in some embodiments. The embodiments of the present disclosure will be described below with reference to the drawings.

Figure 2:
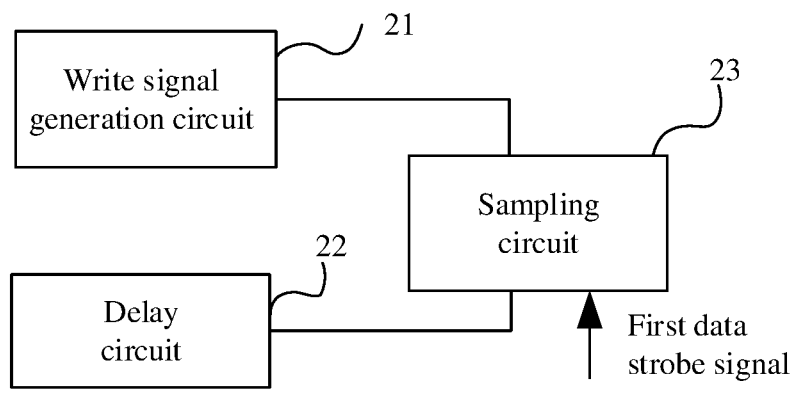
FIG. 2 is a structural schematic diagram of a write leveling circuit applied to a memory according to an embodiment of the present disclosure.

FIG. 2 is a structural schematic diagram of a write leveling circuit applied to a memory according to an embodiment of the present disclosure. As shown in FIG. 2, the write leveling circuit includes: a write signal generation circuit 21 configured to perform delay processing on a first write signal according to a received first clock signal, and output a second write signal; a delay circuit 22 configured to perform delay processing on a received first data strobe signal, and output a second data strobe signal; and a sampling circuit 23 connected to the delay circuit 22 and the write signal generation circuit 21 respectively, and configured to receive the second data strobe signal output by the delay circuit 22 and the second write signal output by the write signal generation circuit 21, and output a first sampling signal according to the second data strobe signal and the second write signal. The sampling circuit 23 is further configured to receive the first data strobe signal and the second write signal output by the write signal generation circuit 21, and output a second sampling signal according to the first data strobe signal and the second write signal.

As an example, in this embodiment, the write leveling circuit includes the write signal generation circuit 21, the delay circuit 22 and the sampling circuit 23. The write signal generation circuit 21 is configured to perform delay processing on a first write signal generated by the write signal generation circuit 21 based on a received first clock signal to obtain a second write signal, and output the obtained second write signal to the sampling circuit 23 connected to the write signal generation circuit 21.

In addition, the delay circuit 22 is further provided in the write leveling circuit, and the delay circuit 22 may be used to perform delay processing on a received first data strobe signal to obtain a second data strobe signal, and to send the second data strobe signal to the sampling circuit 23 connected to the delay circuit 22. When the write leveling circuit is disposed inside the memory, the first data strobe signal received by the delay circuit 22 may be considered to be a data strobe signal transmitted in the memory, which may be obtained by converting a data strobe signal received at a pin of the memory. The first clock signal received by the write signal generation circuit 21 may be considered to be a clock signal transmitted in the memory, which may be obtained by converting a clock signal received at a pin of the memory. It should be noted that the memory specifications of the memory are not particularly limited in the present disclosure, and the memory may be a memory having DDR5 memory specifications, or a memory having other memory specifications.

Moreover, the sampling circuit 23 in this embodiment is configured to generate a first sampling signal based on the second write signal output by the write signal generation circuit 21 connected thereto and the second data strobe signal output by the delay circuit 22 connected thereto. Further, the sampling circuit 23 is further configured to receive the first data strobe signal, and to generate a second sampling signal based on the received first data strobe signal and the second write signal output by the write signal generation circuit 21 connected thereto.

After the sampling circuit 23 in the write leveling circuit generates the first sampling signal and the second sampling signal, in some embodiments, the write leveling circuit in the memory outputs both the first sampling signal and the second sampling signal to a controller corresponding to the memory, such that the controller can adjust a signal sent to the memory by the controller based on the received first sampling signal and the received second sampling signal, thereby ensuring that the time difference between an active edge of a data strobe signal received by the memory and an active edge of a clock signal satisfies a time difference range specified by the memory. The controller, when adjusting a signal sent to the memory, may adjust the delay of a data strobe signal sent to the memory, which is not specifically limited here. Further, an active edge of a signal mentioned in the present disclosure may be a rising edge of the signal, or may be a falling edge of the signal.

In this embodiment, provided is a write leveling circuit applicable to a memory. A sampling circuit 23, a delay circuit 22 and a write signal generation circuit 21 are provided in the write leveling circuit, so that the sampling circuit 23 can output a first sampling signal based on a second data strobe signal output by the delay circuit 22 and a second write signal output by the write signal generation circuit 21; and the sampling circuit 23 can further output a second sampling signal based on a first data strobe signal received and the second write signal output by the write signal generation circuit 21. In this way, a corresponding controller outside the memory can adjust signals sent by the controller to the memory based on the first sampling signal and the second sampling signal output by the sampling circuit 23 in the write leveling circuit, such that the time difference between an active edge of a data strobe signal received by the memory and an active edge of a clock signal satisfies specification requirements of the memory, thereby ensuring that data can be written into the memory correctly.

Figure 3:
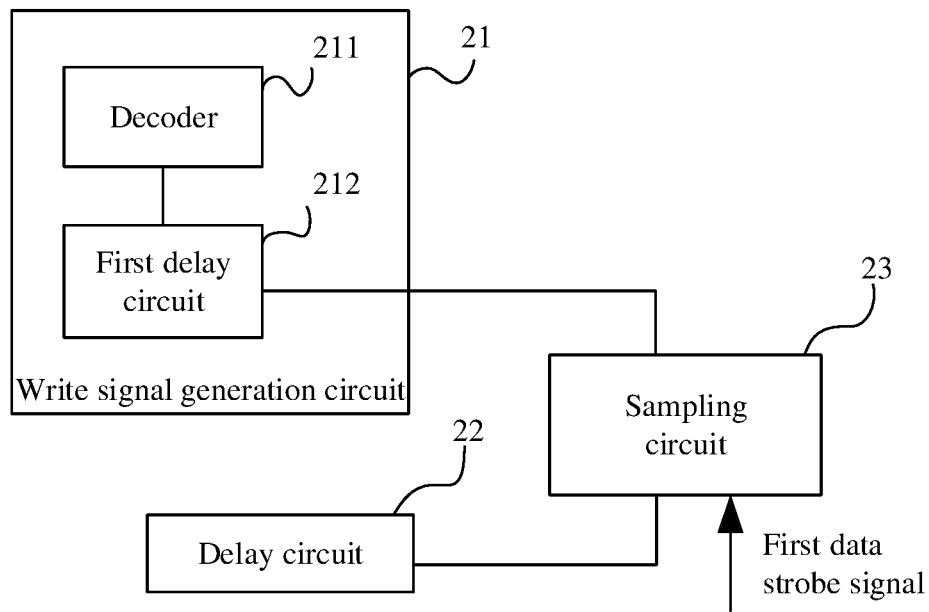
FIG. 3 is a structural schematic diagram of another write leveling circuit applied to a memory according to an embodiment of the present disclosure.

In some embodiments, FIG. 3 is a structural schematic diagram of another write leveling circuit applied to a memory according to an embodiment of the present disclosure. On the basis of the structure of the apparatus shown in FIG. 2, a write signal generation circuit in this embodiment includes: a decoder 211 configured to decode a received write instruction, and output a first write signal; and a first delay circuit 212 connected to the decoder 211 and configured to perform delay processing on the first write signal based on a received first clock signal, and output a second write signal.

As an example, as shown in FIG. 3, the write signal generation circuit in this embodiment includes the decoder 211 and the first delay circuit 212. The write instruction received by the decoder 211 may be considered as a write instruction sent by a corresponding controller outside a memory that contains the write signal generation circuit internally, namely, a write instruction sent by the controller to a pin of the memory, and used to indicate that a write operation needs to be performed on the memory currently.

The decoder 211 in the write signal generation circuit, upon receiving the write instruction, may decode the write instruction to obtain a first write signal that can be identified by components in the memory and is used to indicate that a write operation needs to be performed currently. Then, the decoder 211 sends the obtained first write signal to the first delay circuit 212 connected to the decoder 211, and the first delay circuit 212 performs delay processing on the received first write signal based on the first clock signal to obtain a second write signal, and outputs the second write signal to the sampling circuit 23 connected to the first delay circuit 212.

It will be appreciated that in this embodiment, the decoder 211 is provided in the write signal generation circuit 21 to decode the write instruction received by the decoder 211, so that components in the memory can accurately determine that a write operation needs to be performed on the memory currently. Further, during subsequent signal adjustment based on the write leveling circuit, the controller can determine a data strobe signal required by the memory more accurately, thereby improving the data writing accuracy of the memory.

In some embodiments, on the basis of the structure shown in FIG. 3, the first delay circuit 212 in the write signal generation circuit 21 in this embodiment is specifically configured to: perform delay processing on the first write signal based on the received first clock signal, a column address strobe write latency of the memory and a first indication signal, and output a second write signal, where the first indication signal is used to indicate a reduced time of the column address strobe write latency of the memory.

As an example, in this embodiment, during the process in which the first delay circuit 212 performs delay processing on the first write signal output by the decoder 211 to obtain a second write signal, particularly, the first delay circuit 212 may perform delay processing on the first write signal based on the reduced time of the column address strobe write latency (CWL) of the memory indicated by the received first indication signal, the first clock signal, and the CWL of the memory.

For example, in one possible implementation, the first delay circuit 212 may perform differencing on the CWL of the memory and the reduced time indicated by the first indication signal, and use a delay time indicated by the differencing result as the time difference between the first write signal and the second write signal when the first delay circuit 22 performs delay processing on the first write signal. The clock cycle of the first clock signal may serve as a time reference for a delay time indicated by the differencing result. For example, when the differencing result is 0.5 tck, the obtained delay time between the first write signal and the second write signal is the result of 0.5 multiplied by the clock cycle of the first clock signal.

It should be noted that the CWL of the memory acquired by the first delay circuit 212 may be pre-stored in the first delay circuit 212, or may be determined by the first delay circuit 212 from a received third indication signal, where the third indication signal may be used to indicate the currently required CWL of the memory. Further, the CWL of the memory may also be adjusted continually based on a read/write speed of the memory desired by a user. For example, the controller may, based on the required read/write speed of the memory, find an indication signal for a CWL corresponding to the read/write speed, and send the indication signal to the first delay circuit 212 in the memory, so that the first delay circuit 212 may perform delay processing on the received first write signal.

Further, in one possible implementation, the delay between the first write signal in the write signal generation circuit 21 and the second write signal output by the write signal generation circuit 21 not only includes the difference between the CWL of the memory and the reduced time indicated by the first indication signal, but also includes a signal delay caused by electronic components such as an inverter disposed to improve signal transmission quality when the first write signal that has undergone the delay processing is being transmitted to the sampling circuit 23.

It will be appreciated that in this embodiment, when the first delay circuit 212 performs delay processing on the first write signal output by the decoder 211, the CWL of the memory and the reduced time of the CWL indicated by the first indication signal are taken into account to perform delay processing on the first write signal. Furthermore, when the controller outside the memory that contains the write leveling circuit determines, by means of the write leveling circuit, the data strobe signal to be received by the memory, the active edge of the received first data strobe signal in the memory may be aligned with that of the second write signal by adjusting the reduced time indicated by the first indication signal.

Figure 4:
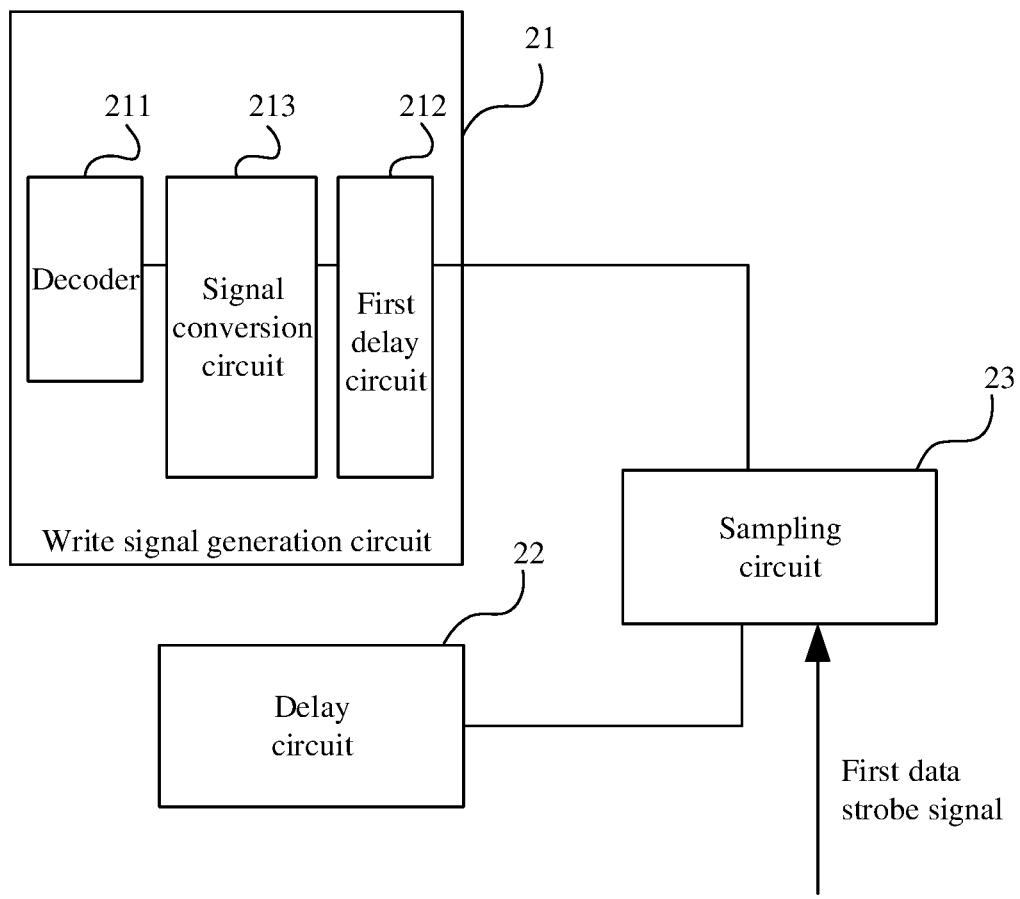
FIG. 4 is a structural schematic diagram of still another write leveling circuit applied to a memory according to an embodiment of the present disclosure.

In some embodiments, FIG. 4 is a structural schematic diagram of still another write leveling circuit applied to a memory according to an embodiment of the present disclosure. On the basis of the structure of the apparatus shown in FIG. 3, in this embodiment, the write signal generation circuit 21 further includes a signal conversion circuit 213. The decoder 211 is connected to the first delay circuit 212 via the signal conversion circuit 213. The signal conversion circuit 213 is configured to perform pulse broadening on the first write signal output by the decoder 211, and output a broadened write signal to the first delay circuit 212.

As an example, as shown in FIG. 4, in this embodiment, the write signal generation circuit 21 in the write leveling circuit includes a decoder 211, a signal conversion circuit 213 and a first delay circuit 212. The decoder 211 is configured to receive a write instruction and decode the write instruction, and send a decoded signal to the signal conversion circuit 213 connected to the decoder 211. Then, the signal conversion circuit 213 performs pulse broadening on the decoded signal output by the decoder 211, and outputs the signal that has undergone the pulse broadening as a first write signal to the first delay circuit 212 connected to the signal conversion circuit, so that the first delay circuit 212 may perform delay processing on the received first write signal to obtain a second write signal.

It will be appreciated that the signal conversion circuit 213 in the write signal generation circuit 21 in this embodiment performs pulse broadening on the signal output to the signal conversion circuit 213 by the decoder 211, so as to meet corresponding specification requirements (e.g., SPEC requirements) of the memory.

On the basis of any one of the above embodiments, the sampling circuit 23 in the write leveling circuit provided in this embodiment includes: a first flip-flop 231, a second flip-flop 232, and a multiplexer 233. A data terminal of the first flip-flop 231 is connected to the write signal generation circuit 21 and configured to receive the second write signal output by the write signal generation circuit 21. A clock terminal of the first flip-flop 231 is connected to an output terminal of the delay circuit 22 and configured to receive the second data strobe signal output by the delay circuit 22. The first flip-flop 231 is configured to output a first sampling signal based on the second write signal and the second data strobe signal. A data terminal of the second flip-flop 232 is connected to the write signal generation circuit 21 and configured to receive the second write signal output by the write signal generation circuit 21. A clock terminal of the second flip-flop 232 is configured to receive the first data strobe signal. The second flip-flop 232 is configured to output a second sampling signal based on the second write signal and the first data strobe signal. An output terminal of the first flip-flop 231 is connected to a first terminal of the multiplexer 233, and an output terminal of the second flip-flop 232 is connected to a second terminal of the multiplexer 233.

Figure 5:
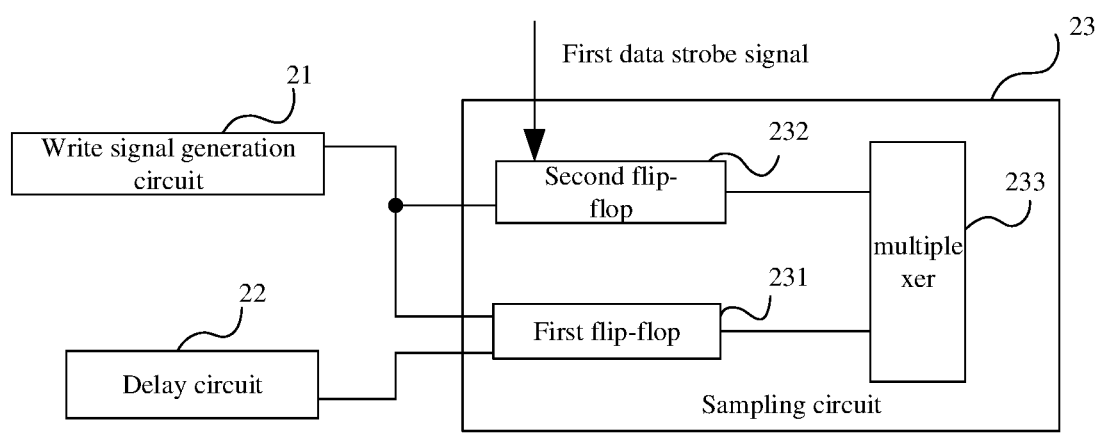
FIG. 5 is a structural schematic diagram of yet another write leveling circuit applied to a memory according to an embodiment of the present disclosure.

As an example, as shown in FIG. 5, which is a structural schematic diagram of yet another write leveling circuit applied to a memory according to an embodiment of the present disclosure, and on the basis of the structure shown in FIG. 2, the write leveling circuit in this embodiment includes a first flip-flop 231, a second flip-flop 232 and a multiplexer 233. A clock terminal and a data terminal of the first flip-flop 231 are respectively connected to the delay circuit 22 and the write signal generation circuit 21, so that the first flip-flop 231 samples, based on the active edge of the second data strobe signal received by the clock terminal of the first flip-flop and sent by the delay circuit 22 connected to the first flip-flop, a second write signal received by the data terminal of the first flip-flop 231 and output by the write signal generation circuit 21 connected to the first flip-flop, uses the sampling result as a first sampling signal and outputs the same to the multiplexer 233 connected to the first flip-flop 231.

Further, the clock terminal of the second flip-flop 232 is configured to receive the first data strobe signal, the data terminal of the second flip-flop 232 is connected to the write signal generation circuit 21 and configured to receive the second write signal output by the write signal generation circuit 21, and then, the second flip-flop 232 samples the second write signal received by the second flip-flop 232 based on the active edge of the received first data strobe signal, uses the sampling result as a second sampling signal and outputs the same to the multiplexer 233 connected to the second flip-flop 232.

The multiplexer 233, after receiving the first sampling signal sent by the first flip-flop 231 connected thereto and the second sampling signal sent by the second flip-flop 232 connected thereto, may select and output one of the sampling signals therefrom, so that the controller outside the memory can adjust the signal sent by the controller to the memory based on the received first sampling signal or the received second sampling signal.

It will be appreciated that in this embodiment, by providing the first flip-flop 231, the second flip-flop 232, and the multiplexer 233 in the sampling circuit 23, compared with sending both the first and second sampling signals to the controller, the sampling circuit 23 provided in this embodiment can reduce the occupancy of a data-receiving port on the controller, and can also reduce the occupancy of a pin on the memory when the write leveling circuit is packaged in the memory.

On the basis of the structure of any one of the write leveling circuits applied to a memory provided above, in this embodiment, the write leveling circuit further includes a first converter 24, connected to both the delay circuit 22 and the sampling circuit 23, and configured to perform logic level conversion on a received third data strobe signal to obtain the first data strobe signal, where the level of the third data strobe signal is a current model logic (CML) level; and the level of the first data strobe signal is a complementary metal oxide semiconductor (CMOS) level.

As an example, the write leveling circuit provided in this embodiment further includes the first converter 24. The third data strobe signal received by the first converter 24 may be considered to be a data strobe signal sent by a controller outside the memory to a pin of the memory in an actual application. When the controller sends the third data strobe signal to the memory, a CML level transmission form is typically used in order to increase the transmission efficiency of the signal. And in the memory, signal transmission is typically performed using a CMOS level transmission form. Thus, the first converter 24 in the write leveling circuit, after acquiring the third data strobe signal at the pin, may convert the third data strobe signal transmitted in the CML level transmission form into the first data strobe signal transmitted in the CMOS level transmission form, so that various components in the write leveling circuit in the memory can accurately identify the first data strobe signal.

On the basis of the structure of any one of the write leveling circuits applied to a memory provided above, in this embodiment, the write leveling circuit further includes a second converter 25, connected to the write signal generation circuit 21 and configured to perform logic level conversion on a received second clock signal to obtain the first clock signal, where the level of the second clock signal is a CML level, and the level of the first clock signal is a CMOS level.

As an example, in this embodiment, the write leveling circuit provided in this embodiment further includes a second converter 25. The second clock signal received by the second converter 25, in an actual application, may be considered to be a clock signal sent to a pin of the memory by a controller outside the memory or by a previous memory connected in series with the memory. When a clock signal is sent by the controller to the memory or is sent between memories, in order to increase the transmission efficiency of the signal, a CML level transmission form is typically used. And in the memory, signal transmission is typically performed using a CMOS level transmission form. Thus, the second converter 25 in the write leveling circuit, after acquiring the second clock signal at the pin, may convert the second clock signal transmitted in the CML level transmission form into the first clock signal transmitted in the CMOS level transmission form, so that various components in the write leveling circuit in the memory can accurately identify the first clock signal.

Figure 6:
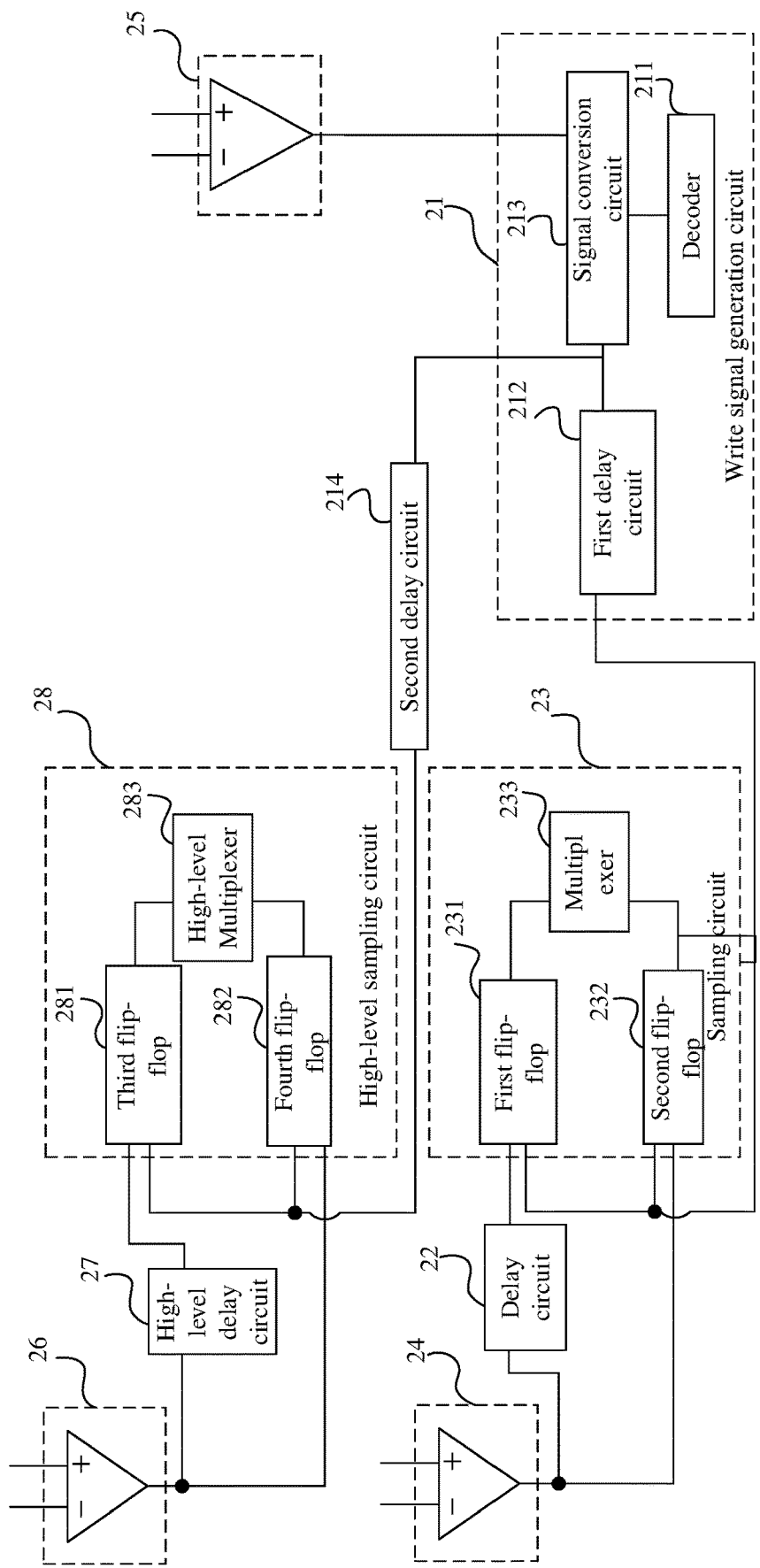
FIG. 6 is a structural schematic diagram of still yet another write leveling circuit applied to a memory according to an embodiment of the present disclosure.

FIG. 6 is a structural schematic diagram of still yet another write leveling circuit applied to a memory according to an embodiment of the present disclosure. As shown in the figure, in this embodiment, when the write leveling circuit is disposed within the memory, and a high-level data strobe signal receiving pin and a low-level data strobe signal receiving pin are respectively provided in the memory, the first converter 24 in the write leveling circuit may be configured to receive a third data strobe signal input from the low-level data strobe signal receiving pin of the memory, and to perform logic level conversion on the third data strobe signal to obtain a first data strobe signal to be respectively transmitted to the delay circuit 22 connected to the first converter 24 and the second flip-flop 232 in the sampling circuit 23.

The delay circuit 22, after receiving the first data strobe signal, may perform delay processing on the first data strobe signal, and then transmit the second data strobe signal obtained by this delay processing to the first flip-flop 231 in the sampling circuit 23 connected to the delay circuit 22.

Further, the write leveling circuit further includes a second converter 25. The second converter 25 is configured to receive a second clock signal input from a pin of the memory, perform logic level conversion on the second clock signal, and transmit the first clock signal obtained by the logic level conversion to the signal conversion circuit 213 in the write signal generation circuit 21 connected to the second converter 25.

The decoder 211 in the write signal generation circuit 21 is configured to generate a first write signal based on a received write instruction, and then to transmit the generated first write signal to the signal conversion circuit 213 connected to the decoder 211. The signal conversion circuit 213, after receiving the first write signal, may perform pulse broadening on the first write signal, and sends a broadened signal to the first delay circuit 212 connected to the signal conversion circuit 213, and the first delay circuit 212 performs delay processing on the broadened signal to obtain a second write signal. Then, the first delay circuit 212 will transmit the obtained second write signal to both the first flip-flop 231 and the second flip-flop 232 connected to the first delay circuit 212.

In the sampling circuit 23, the first flip-flop 231 performs sampling based on the second write signal output by the first delay circuit 212 and received by the data terminal of the first flip-flop, and the second data strobe signal output by the delay circuit 22 and received by the clock terminal of the first flip-flop, to generate a first sampling signal, and outputs the first sampling signal to the multiplexer 233 connected to the first flip-flop 231. Similarly, the second flip-flop 232 performs sampling based on the second write signal output by the first delay circuit 212 and received by the data terminal of the second flip-flop, and the first data strobe signal output by the first receiver 24 and received by the clock terminal of the second flip-flop, to generate a second sampling signal, and outputs the second sampling signal to the multiplexer 233 connected to the second flip-flop 232.

It will be appreciated that when the third data strobe signal received by the first converter 24 is a low-level data strobe signal and the pins of the memory further include a high-level data strobe signal receiving pin, a third converter 26 may further be provided in the write leveling circuit. The third converter 26 is configured to perform logic level conversion on the received high-level data strobe signal, and to send the signal that has undergone the logic level conversion to both a high-level delay circuit 27 connected to the third converter 26 and a fourth flip-flop 282 connected to the third converter 26. In this embodiment, the high-level delay circuit 27 has a function consistent with that of the delay circuit 22, and is configured to perform delay processing on a received data strobe signal and to send the signal that has undergone the delay processing to a third flip-flop 281 connected to the high-level delay circuit 27.

In addition, a second delay circuit 214 is further provided in the write leveling circuit. The second delay circuit 214 is configured to perform delay processing on the signal that has undergone the pulse broadening and is output by the signal conversion circuit 213 connected to the second delay circuit 214, and to send the signal that has undergone the delay processing to both the third flip-flop 281 and the fourth flip-flop 282 connected to the second delay circuit 214.

In a high-level sampling circuit 28, the third flip-flop 281 performs sampling based on the signal output by the second delay circuit 214 and received by the data terminal of the third flip-flop, and the signal output by the high-level delay circuit 27 and received by the clock terminal of the third flip-flop, to generate a third sampling signal, and outputs the third sampling signal to a high-level multiplexer 283 connected to the third flip-flop 28. Similarly, the fourth flip-flop 282 performs sampling based on the signal output by the second delay circuit 214 and received by the data terminal of the fourth flip-flop, and the signal output by the third receiver 26 and received by the clock terminal of the fourth flip-flop, to generate a fourth sampling signal, and outputs the fourth sampling signal to the high-level multiplexer 283 connected to the fourth flip-flop 282.

It will be appreciated that when the memory includes a low-level data strobe signal receiving pin and a high-level data strobe signal receiving pin, it is necessary to ensure that the time difference between an active edge of a low-level data strobe signal received by the memory and an active edge of the clock signal satisfies the specification setting of the memory, and it is also necessary to ensure that the time difference between an active edge of a high-level data strobe signal received by the memory and the active edge of the clock signal satisfies the specification setting of the memory. Thus, two converters (i.e., the first converter 24 and the third converter 26 in the figure) configured to perform logic level conversion on received data strobe signals, two delay circuits (i.e., the delay circuit 22 and the delay circuit 27 in the figure) and two sampling circuits (i.e., the sampling circuit 23 and the high-level sampling circuit 28 in the figure) may be provided in the write leveling circuit in the memory. With the design of the write leveling circuit described above, it can ensure that after the controller outside the memory has adjusted the signal sent to the memory, the time difference between the active edge of the low-level data strobe signal received by the memory and the active edge of the clock signal satisfies the specification setting of the memory, and the time difference between the active edge of the high-level data strobe signal received by the memory and the active edge of the clock signal satisfies the specification setting of the memory, thereby improving the data writing accuracy of the memory. For example, the controller may adjust the data strobe signal received by the first converter 24 or adjust the delay when the first delay circuit performs delay processing, so as to ensure that the time difference between the active edge of the low-level data strobe signal received by the memory and the active edge of the clock signal satisfies the specification setting of the memory. And, the controller may also adjust the data strobe signal received by the third converter 26 or adjust the delay when the second delay circuit performs delay processing, so as to ensure that the time difference between the active edge of the high-level data strobe signal received by the memory and the active edge of the clock signal satisfies the specification setting of the memory.

On the basis of any one of the above embodiments, the first sampling signal in this embodiment is used to indicate whether the active edge of the first clock signal is aligned with that of the first data strobe signal.

As an example, in the process of performing write leveling on the memory, the write leveling is typically includes external write leveling and internal write leveling, where external write leveling is used to align data strobe signals received at the pins of the memory with clock signals. In this embodiment, in order to enable the first sampling signal output by the sampling circuit 23 to indicate whether the active edge of the first data strobe signal is aligned with that of the first clock signal, the delay when the delay circuit 22 performs delay processing on the first data strobe signal is made equivalent to the delay when the write signal generation circuit 21, upon receiving the first clock signal, performs delay processing on the first write signal to obtain the second write signal, so that the result of whether the active edge of the received second data strobe signal is aligned with that of the second write signal, as indicated by the first sampling signal output by the sampling circuit 23, is always consistent with the result of whether the active edge of the first data strobe signal is aligned with that of the first clock signal. By configuring the delay of the delay circuit 22 as described above, it is possible to determine, based on the first sampling signal output by the sampling circuit 23, whether external write leveling of the memory is achieved.

In some embodiments, on the basis of any one of the above embodiments, the first sampling signal is specifically configured to instruct an adjustment of the delay of the first data strobe signal when the first sampling signal indicates that the active edge of the first clock signal is misaligned with that of the first data strobe signal.

As an example, in this embodiment, to achieve training on external write leveling of the memory, when the controller outside the memory has determined that the first sampling signal indicates that the active edge of the first clock signal is misaligned with that of the first data strobe signal, the controller may continually adjust the delay of a data strobe signal sent to the memory, i.e., continually adjust the delay of the first data strobe signal, so that the active edge of the first clock signal is aligned with that of the first data strobe signal.

It should be noted that in the present disclosure, whether active edges of two signals are aligned or not may be determined by determining whether the time difference between the times corresponding to the active edges of the two signals is within a preset difference range, and when the time difference is within the preset difference range, it is indicated that the active edges of the two signals are aligned.

In some embodiments, the second sampling signal indicates whether the active edge of the first data strobe signal is aligned with that of the second write signal.

As an example, the process of performing write leveling on the memory further includes internal write leveling, which is mainly configured to ensure whether the active edge of the first data strobe signal received in the memory is aligned with that of the second write signal on the basis of reducing a transmission path of the data strobe signal transmitted in the memory.

In an external leveling process, a delay circuit 22 is disposed in the memory to perform delay processing on the received first data strobe signal. However, when the delay corresponding to delay processing by the delay circuit 22 is longer, there are more power consumption and jitters in the write leveling circuit. Therefore, in order to reduce the transmission path of the data strobe signal in the memory, in an internal write leveling process, the sampling circuit 23 outputs a second sampling signal directly based on the first data strobe signal and a second write signal generated by the write signal generation circuit connected to the sampling circuit, so that whether the active edge of the first data strobe signal is aligned with that of the second write signal is determined by means of the second sampling signal. For example, the sampling circuit 23 may perform differencing on the time corresponding to each active edge of the first data strobe signal and the time corresponding to each active edge of the second write signal, so as to determine whether the active edge of the first data strobe signal is aligned with that of the second write signal.

In some embodiments, the second sampling signal is specifically configured to instruct an adjustment of the delay of the first write signal or the delay of the first data strobe signal when the first sampling signal indicates that the active edge of the first clock signal is aligned with that of the first data strobe signal and when the active edge of the first data strobe signal is misaligned with that of the second write signal.

As an example, in the internal write leveling process, in order to avoid the problem of large power consumption during signal transmission in the memory, adjustment can be made in the following manner. In this embodiment, after the external write leveling process ends, that is, when the first sampling signal indicates that the active edge of the first clock signal is aligned with that of the first data strobe signal and when the second sampling signal indicates that the active edge of the first data strobe signal is misaligned with that of the second write signal, the delay of the first write signal or the delay of the first data strobe signal may be adjusted to enable the active edge of the first data strobe signal to be aligned with that of the second write signal.

It will be appreciated that compared with the manner in which the first data strobe signal needs to be output after delay processing by the delay circuit in the external write leveling process, in the internal write leveling process, it is not necessary to perform delay processing on the first data strobe signal, which is equivalent to reducing the delay when the first data strobe signal is transmitted in the memory. In addition, power consumption caused by the first write signal during transmission may then be reduced by adjusting the delay of the first write signal, and then, the delay of the first write signal or the delay of the first data strobe signal is continually adjusted to ensure that internal write leveling is achieved.

Figure 7:
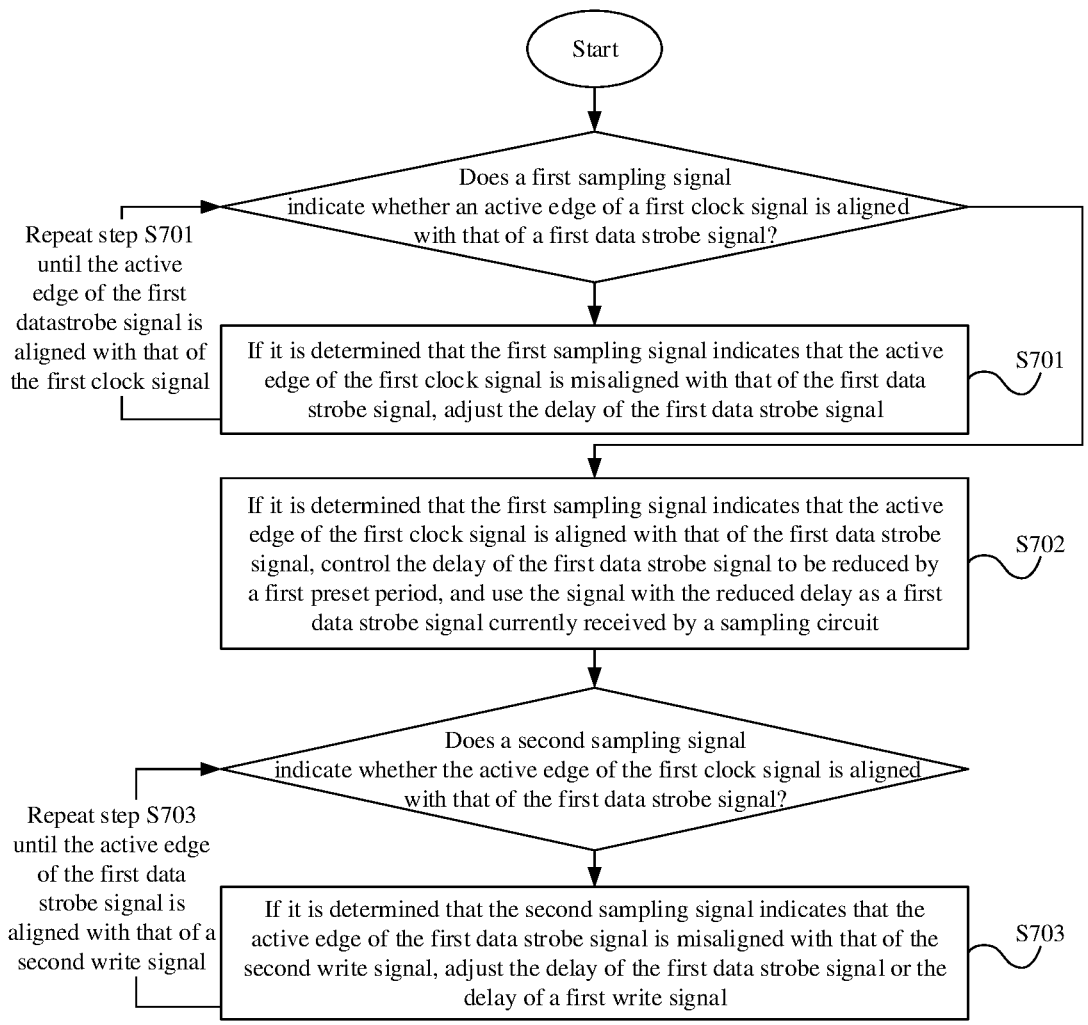
FIG. 7 is a schematic flowchart of a method for controlling a write leveling circuit applied to a memory according to an embodiment of the present disclosure.

FIG. 7 is a schematic flowchart of a method for controlling a write leveling circuit applied to a memory according to an embodiment of the present disclosure, and the method provided in this embodiment is applied to the write leveling circuit shown in FIG. 2, and includes the following operations:

S701: if it is determined that a first sampling signal indicates that an active edge of a first clock signal is misaligned with that of a first data strobe signal, the delay of the first data strobe signal is adjusted.

Operation S701 is repeated until it is determined, based on a first sampling signal output by a sampling circuit, that the active edge of the first data strobe signal is aligned with that of the first clock signal.

As an example, an execution entity of the present embodiment may be a controller outside the memory or other electronic devices, which is not particularly limited in the present disclosure. The following description is made by using the controller as the execution entity of the present disclosure.

In the process of performing write leveling on the memory, first, the controller receives a first sampling signal output by the write leveling circuit, and when the controller determines, based on the first sampling signal, that the active edge of the first clock signal is misaligned with that of the first data strobe signal, the controller continually adjusts the delay of a data strobe signal sent to the memory, i.e., continually changes the delay of the first data strobe signal, so that the first data strobe signal is aligned with the first clock signal. It should be noted that in this embodiment, the size of the delay of the data strobe signal in each adjustment by the controller may be the same value, or a different value, which is not particularly limited in this embodiment.

Further, it should be noted that in this embodiment, the first sampling signal is generated by the sampling circuit of the write leveling circuit comparing whether an active edge of a second data strobe signal output by the delay circuit is aligned with that of a second write signal, and since the delay when the delay circuit performs delay processing on the first data strobe signal is equivalent to the delay when the write signal generation circuit, upon receiving the first clock signal, performs delay processing on the first write signal to obtain the second write signal, a first sampling signal generated by comparing whether the active edge of the second data strobe signal is aligned with that of the second write signal may indicate whether the active edge of the first data strobe signal is aligned with that of the first clock signal.

In one example, the first sampling signal may be the time difference between the active edge of the second data strobe signal received by the sampling circuit and the active edge of the second write signal received by the sampling circuit, and the controller determines whether the active edges of the two signals are aligned by comparing the time difference with a preset time difference range.

S702: if it is determined that the first sampling signal indicates that the first clock signal is aligned with the first data strobe signal, the delay of the first data strobe signal is controlled to be reduced by a first preset period, and the signal with the reduced delay is used as a first data strobe signal currently received by the sampling circuit.

As an example, when the controller determines, based on the first sampling signal, that the first clock signal is aligned with the first data strobe signal, it is indicated that the external write leveling process in the write leveling process of the memory is completed. Then, the controller reduces, by the first preset period, the delay of the first data strobe signal when in alignment, and uses the first data strobe signal with the delay reduced by the first preset period as a first data strobe signal initially input into the sampling circuit of the write leveling circuit during the internal write leveling process in the memory.

It should be noted that the first preset period in this embodiment may be determined based on a write preamble signal and a correspondence relationship between the write preamble signal and the first preset period.

S703: if it is determined that the second sampling signal indicates that the active edge of the first data strobe signal is misaligned with that of the second write signal, the delay of the first data strobe signal or the delay of the first write signal is adjusted.

Operation S703 is repeated until it is determined, based on the second sampling signal output by the sampling circuit, that the active edge of the first data strobe signal is aligned with that of the second write signal.

As an example, when internal write leveling is performed on the memory, first, when the controller determines, based on the second sampling signal, that the active edge of the first data strobe signal is misaligned with that of the second write signal, the controller may adjust the delay of the first data strobe signal and the delay of the first write signal to ensure that the active edge of the first data strobe signal is aligned with that of the second write signal, i.e., to ensure that a data strobe signal received by a storage unit portion in the memory is aligned with a write signal.

It will be appreciated that there is provided a method for controlling a write leveling circuit applied to a memory in this embodiment, and the controller may control the write leveling circuit based on a first sampling signal and a second sampling signal output by the write leveling circuit so as to complete write leveling of the memory. Further, in the control process, the controller may first determine whether to adjust the delay of the first data strobe signal based on whether the active edges of the signals are aligned as indicated by the first sampling signal, so as to complete the external write leveling process of the memory. Moreover, in order to reduce the power consumption and the delay caused by transmission of the data strobe signal as well as the write signal in the memory, in the internal write leveling process, the controller may further continually adjust the delay of the first data strobe signal or the delay of the first write signal based on the received second sampling signal, so as to finally complete the write leveling process of the memory, and enable data to be accurately written into the memory.

In some embodiments, on the basis of the method shown in FIG. 7, if it is determined that the active edge of the first data strobe signal is aligned with that of the second write signal, the delay of the first data strobe signal is extended by a second preset period and the signal with the extended delay is determined to be a data strobe signal received when a write operation is performed on the memory.

As an example, in this embodiment, on the basis of the method for controlling the write leveling circuit shown in FIG. 7 above, to further ensure that the time difference between an active edge of a data strobe signal received at a pin of the memory and an active edge of a clock signal received at a pin satisfies specification requirements of the memory, the controller may, upon determining that the second sampling signal indicates that the active edge of the first data strobe signal is aligned with that of the second write signal, extend, by the second preset period, the delay of the first data strobe signal when in alignment, and use the data strobe signal with the extended delay as a first data strobe signal received by the memory during a write operation. Moreover, at this time, when the active edge of the first data strobe signal with the delay extended by the second preset period is compared with the active edge of the first clock signal received at the pin of the memory when in alignment, the time difference between the two active edges is compliant with a time difference required by the specifications of the memory (e.g., tDQSoffset of the memory).

It should be noted that the second preset period in the present disclosure may be determined based on a write preamble signal and a correspondence relationship between the write preamble signal and the second preset period.

It will be appreciated that in this embodiment, the delay of the first data strobe signal when the active edge of the first data strobe signal is aligned with that of the second write signal is extended by the second preset period, so as to determine a data strobe signal that needs to be received finally at a pin terminal of the memory, such that data can be accurately written into the memory.

In some embodiments, the operation of determining, based on a first sampling signal output by the sampling circuit, that an active edge of a first data strobe signal is aligned with that of a first clock signal includes: when the level value of the first sampling signal output by the sampling circuit changes from a first level value to a second level value, it is determined that the active edge of the first data strobe signal is aligned with that of the first clock signal.

As an example, in this embodiment, it is possible to determine, based on the first sampling signal generated by the sampling circuit in the write leveling circuit, whether the active edge of the first data strobe signal is aligned with that of the first clock signal by means of detecting the level value of the first sampling signal. Particularly, in this embodiment, when the delay when the delay circuit performs delay processing on the first data strobe signal is equivalent to the delay when the write signal generation circuit, upon receiving the first clock signal, performs delay processing on the first write signal to obtain the second write signal, the result of whether the active edge of the second data strobe signal is aligned with that of the second write signal is always consistent with the result of whether the active edge of the first data strobe signal is aligned with that of the first clock signal. At this point, the sampling circuit may sample the level value of the second write signal at the active edge of the second data strobe signal and then output the sampling result as a first sampling signal, and when the controller determines that the level value of the output first sampling signal is switched from a first level value to a second level value, it is indicated that the active edge of the second data strobe signal is aligned with that of the second write signal, and likewise, the active edge of the first data strobe signal is aligned with the active edge of the first clock signal.

It will be appreciated that in this embodiment, when the first sampling signal output by the sampling circuit can indicate whether the active edge of the second data strobe signal is aligned with that of the second write signal, and when said alignment result is the same as the alignment result of whether the active edge of the first data strobe signal is aligned with that of the first clock signal, whether the active edge of the first data strobe signal is aligned with that of the first clock signal can be determined by detecting whether the signal level value output by the first sampling signal is switched from the first level value to the second level value. The method provided in this embodiment is simple and easy to implement, and has no need of repeatedly calculating the time difference between active edges of signals.

In some embodiments, on the basis of the above embodiments, the operation of determining, based on a second sampling signal output by the sampling circuit, that the active edge of the first data strobe signal is aligned with that of a second write signal includes: when the level value of the second sampling signal output by the sampling circuit changes from the second level value to the first level value, it is determined that the active edge of the first data strobe signal is aligned with that of the second write signal.

As an example, in this embodiment, based on the received first data strobe signal and the received second write signal output by the write signal generation circuit, in order to determine whether the active edge of the first data strobe signal is aligned with that of the second write signal, the sampling circuit may sample the level value of the second write signal at the active edge of the first data strobe signal and uses a sampling result as a second sampling signal output by the sampling circuit, and then changes in the level value of the second sampling signal may be continually monitored, and when the level value of the second sampling signal is switched from the second level value to the first level value, it is indicated that the active edge of the second write signal is aligned with that of the first data strobe signal.

It will be appreciated that in this embodiment, whether the active edge of the first data strobe signal is aligned with that of the second write signal may be determined by detecting whether the level value of the second sampling signal is switched from the second level value to the first level value. The method provided in this embodiment is simple and easy to implement, and has no need of repeatedly calculating the time difference between active edges of signals.

Figure 8:
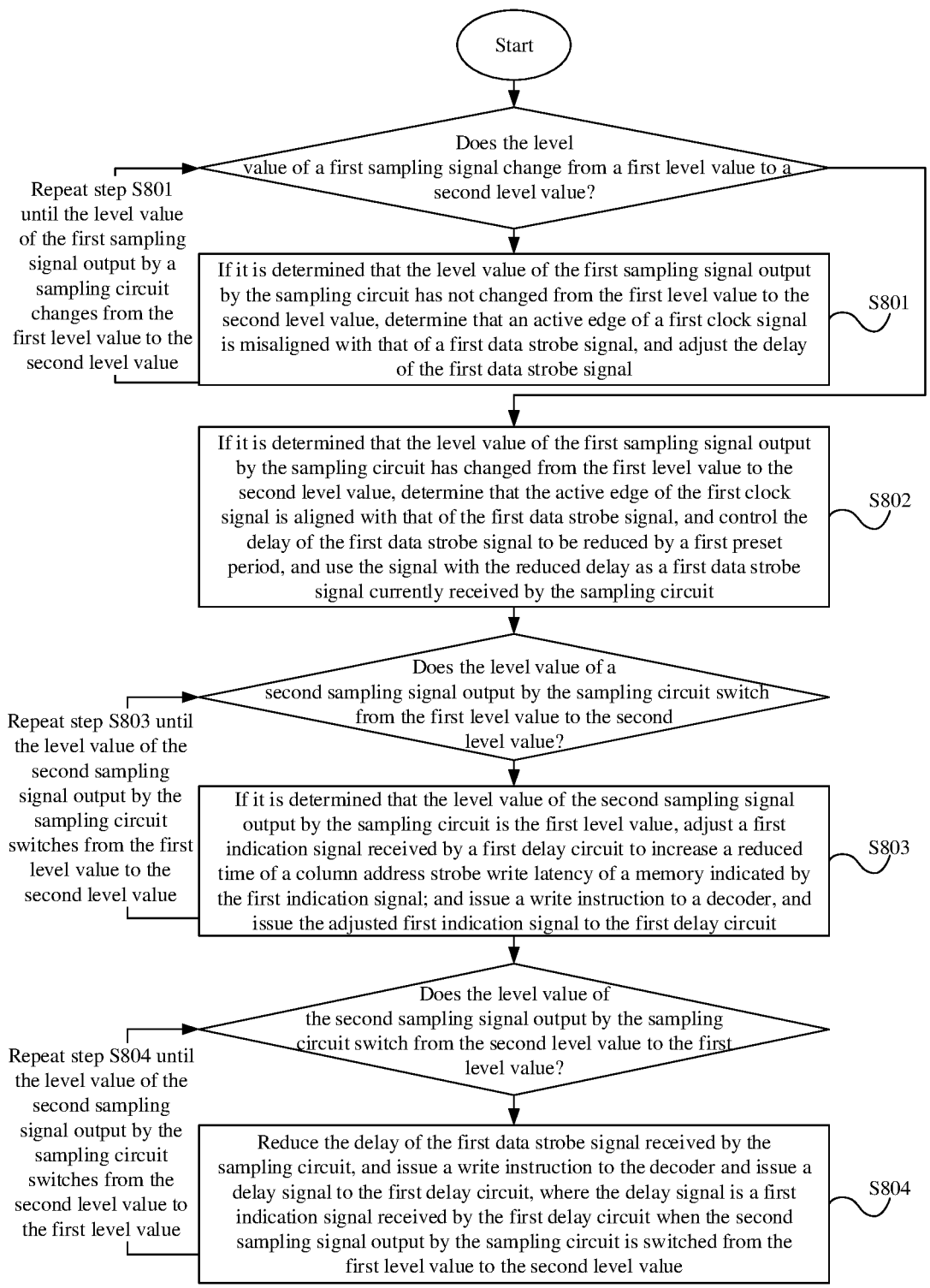
FIG. 8 is a schematic flowchart of another method for controlling a write leveling circuit applied to a memory according to an embodiment of the present disclosure.

FIG. 8 is a schematic flowchart of another method for controlling a write leveling circuit applied to a memory according to an embodiment of the present disclosure. The method provided in this embodiment is applied to the write leveling circuit shown in FIG. 3. The write signal generation circuit in the write leveling circuit includes: a decoder configured to decode a received write instruction to output a first write signal; and a first delay circuit connected to the decoder, and configured to perform delay processing on the first write signal based on the received first clock signal to output the second write signal. The first delay circuit is specifically configured to perform delay processing on the first write signal based on the received first clock signal, a CWL of the memory and a first indication signal to output the second write signal. The first indication signal is used to indicate a reduced time of the CWL of the memory. Based on the above embodiments, the method includes the following operations:

S801: if it is determined that the level value of a first sampling signal output by a sampling circuit has not changed from a first level value to a second level value, it is determined that an active edge of a first clock signal is misaligned with that of a first data strobe signal, and the delay of the first data strobe signal is adjusted.

Operation S801 is repeated until the level value of the first sampling signal output by the sampling circuit changes from the first level value to the second level value, and it is determined, based on this, that the active edge of the first clock signal is aligned with that of the first data strobe signal.

As an example, for the specific principle of operation S801, reference may be made to the specific principle in operation S701 and the above embodiments, and the principle will not be described herein again.

S802: if it is determined that the level value of the first sampling signal output by the sampling circuit has changed from the first level value to the second level value, it is determined that the active edge of the first clock signal is aligned with that of the first data strobe signal, and the delay of the first data strobe signal is controlled to be reduced by a first preset period, and the signal with the reduced delay is used as a first data strobe signal currently received by the sampling circuit.

As an example, for the specific principle of operation S802, reference may be made to the specific principle in operation S702 and the above embodiments, and the principle will not be described herein again.

S803: if it is determined that the level value of the second sampling signal output by the sampling circuit is the first level value, a first indication signal received by the first delay circuit is adjusted to increase a reduced time of the CWL of the memory indicated by the first indication signal; and a write instruction is issued to the decoder, and the adjusted first indication signal is issued to the first delay circuit.

Operation S803 is repeated until the level value of the second sampling signal output by the sampling circuit is switched from the first level value to the second level value.

As an example, in this embodiment, after external write leveling of the memory is completed via operation S801, in order to reduce the power consumption caused by the transmission of the data strobe signal and the write signal in the memory, an adjustment process for internal write leveling of the memory may be further performed after the external write leveling ends. First, during internal write leveling, the delay of the first data strobe signal when the active edge of the first clock signal is aligned with that of the first data strobe signal may be reduced by a first preset period. After the first data strobe signal has changed, the delay of the first write signal output by the decoder needs to be continually adjusted by the first delay circuit in the write signal generation circuit, so that the active edge of the first data strobe signal may be aligned with that of the second write signal output by the write signal generation circuit in the memory.

When the delay of the first write signal is controlled to be reduced, in this embodiment, the reduced time of the CWL indicated by the first indication signal sent to the first delay circuit may be increased, and with the continuous increase of the reduced time, a difference between the CWL and the reduced time (i.e., the delay when the first delay circuit performs delay processing on the first write signal) may decrease continually.

That is, in the internal write leveling process, first, at every adjustment, a write instruction is issued to the decoder in the write leveling circuit, and the adjusted first indication signal is sent to the first delay circuit, and at the same time, it is ensured that the first data strobe signal is unchanged (the first data strobe signal at this point is a corresponding data strobe signal in a case that the delay of the first data strobe signal is reduced by the first preset period when the active edge of the first clock signal is aligned with that of the first data strobe signal), a second sampling signal output by the sampling circuit is acquired, and when the level value indicated by the second sampling signal is the first level value, it indicates that the delay of the first write signal still needs to be reduced.

It should be noted that due to the limitation of a register in the memory, when the reduced time of the CWL indicated by the first indication signal is adjusted, the shortened time of the CWL can only be an integer multiple of the time cycle of the first clock signal. As a result, a change value for each delay can only be an integer multiple of the time cycle when the delay of the first write signal is adjusted. When an output sampling value of the second sampling signal is switched from the first level value to the second level value, the active edge of the first data strobe signal may be misaligned with that of the second write signal, and the time corresponding to the active edge of the first data strobe signal may be later than the time corresponding to the active edge of the second write signal. Therefore, the delay of the first data strobe signal also needs to be adjusted.

S804: the delay of the first data strobe signal received by the sampling circuit is reduced, and a write instruction is issued to the decoder, and a delay signal is issued to the first delay circuit, where the delay signal is a first indication signal received by the first delay circuit when the second sampling signal output by the sampling circuit is switched from the first level value to the second level value.

Operation S804 is repeated until the level value of the second sampling signal output by the sampling circuit is switched from the second level value to the first level value.

As an example, after adjustment in operation S803 is completed, in order to ensure that the active edge of the first data strobe signal is aligned with that of the second write signal, in this operation, the delay of the first data strobe signal may also be adjusted. Since the delay of the first data strobe signal is not limited by the specification of the memory, a variation of each adjustment of the delay needs not be an integer multiple of the clock cycle of the first clock signal. Therefore, in this operation, the active edge of the first data strobe signal can be aligned with that of the second data strobe signal by continually adjusting the delay of the first data strobe signal to constantly reduce the delay of the first data strobe signal. Moreover, in each adjustment process, it is also necessary to send a write instruction to the decoder and issue a delay signal to the first delay circuit, so that the decoder may output a first write signal, and the first delay circuit may perform delay processing on the first write signal output by the decoder connected to the first delay circuit. The duration of delay processing is determined by the delay signal received by the first delay circuit, and the delay signal at this point is a first indication signal received by the first delay circuit when the level value of the second sampling signal is switched from the first level value to the second level value, i.e., the first indication signal received by the first delay circuit when the repeated execution of operation S803 is completed.

It will be appreciated that in this embodiment, in the process of performing an adjustment inside the memory, firstly, the power consumption and delay of the first write signal during transmission are reduced by reducing the delay of the first write signal in delay processing. Then, by adjusting the delay of the first data strobe signal, the active edges of the first data strobe signal and the second write signal may be aligned, so that data may be accurately written when a write operation is performed on the memory, and the power consumption of signal transmission in the memory is also reduced in the write operation process.

In some embodiments, the sampling circuit in the write leveling circuit includes a first flip-flop, a second flip-flop and a multiplexer. A data terminal of the first flip-flop is connected to the write signal generation circuit and configured to receive the second write signal output by the write signal generation circuit. A clock terminal of the first flip-flop is connected to an output terminal of the delay circuit and configured to receive the second data strobe signal output by the delay circuit. The first flip-flop is configured to output the first sampling signal based on the second write signal and the second data strobe signal. The data terminal of the second flip-flop is connected to the write signal generation circuit and configured to receive the second write signal output by the write signal generation circuit. A clock terminal of the second flip-flop is configured to receive the first data strobe signal, and the second flip-flop is configured to output the second sampling signal based on the second write signal and the first data strobe signal. An output terminal of the first flip-flop is connected to a first terminal of the multiplexer, and an output terminal of the second flip-flop is connected to a second terminal of the multiplexer.

At this point, during control of the write leveling circuit, if it is determined that the first sampling signal indicates that the active edge of the first clock signal is misaligned with that of the first data strobe signal, before adjusting the delay of the first data strobe signal, the method for controlling the write leveling circuit further includes: sending a first control signal to the multiplexer. the first control signal is used to instruct the multiplexer to output the first sampling signal; and receiving the first sampling signal output by the multiplexer.

After determining, based on the first sampling signal output by the sampling circuit, that the active edge of the first data strobe signal is aligned with that of the first clock signal, the method further includes: sending a second control signal to the multiplexer, the second control signal is used to instruct the multiplexer to output the second sampling signal.

As an example, an execution entity of the present embodiment may be a controller outside the memory or the other electronic devices, which is not particularly limited in the present disclosure. The following description is made by using the controller as the execution entity of the present disclosure.

When the sampling circuit in the write leveling circuit includes a first flip-flop, a second flip-flop and a multiplexer, in a write leveling process, the controller further needs to issue a control signal to the multiplexer so that the multiplexer may select a currently required sampling signal from a first sampling signal output by the first flip-flop connected to the multiplexer and a second sampling signal output by the second flip-flop connected to the multiplexer.

In the write leveling process, firstly, the controller needs to send a first control signal to the multiplexer so that the multiplexer may output the first sampling signal to the controller until the controller determines, based on the first sampling signal, that the active edge of the first clock signal is aligned with that of the first data strobe signal, and at this point, external write leveling in the write leveling process ends.

Further, when the controller determines that the active edge of the first clock signal is aligned with that of the first data strobe signal, the controller may switch the first control signal sent to the multiplexer to the second control signal so that the multiplexer, after receiving the second control signal, may output a second sampling signal generated by the second flip-flop connected to the multiplexer.

It will be appreciated that when the sampling circuit in the write leveling circuit includes a first flip-flop, a second flip-flop and a multiplexer, the controller may change the sampling signal output by the multiplexer by changing a control signal sent to the multiplexer, so that in both external write leveling and internal write leveling, the controller may accurately receive the required first sampling signal or second sampling signal.

Figure 9:
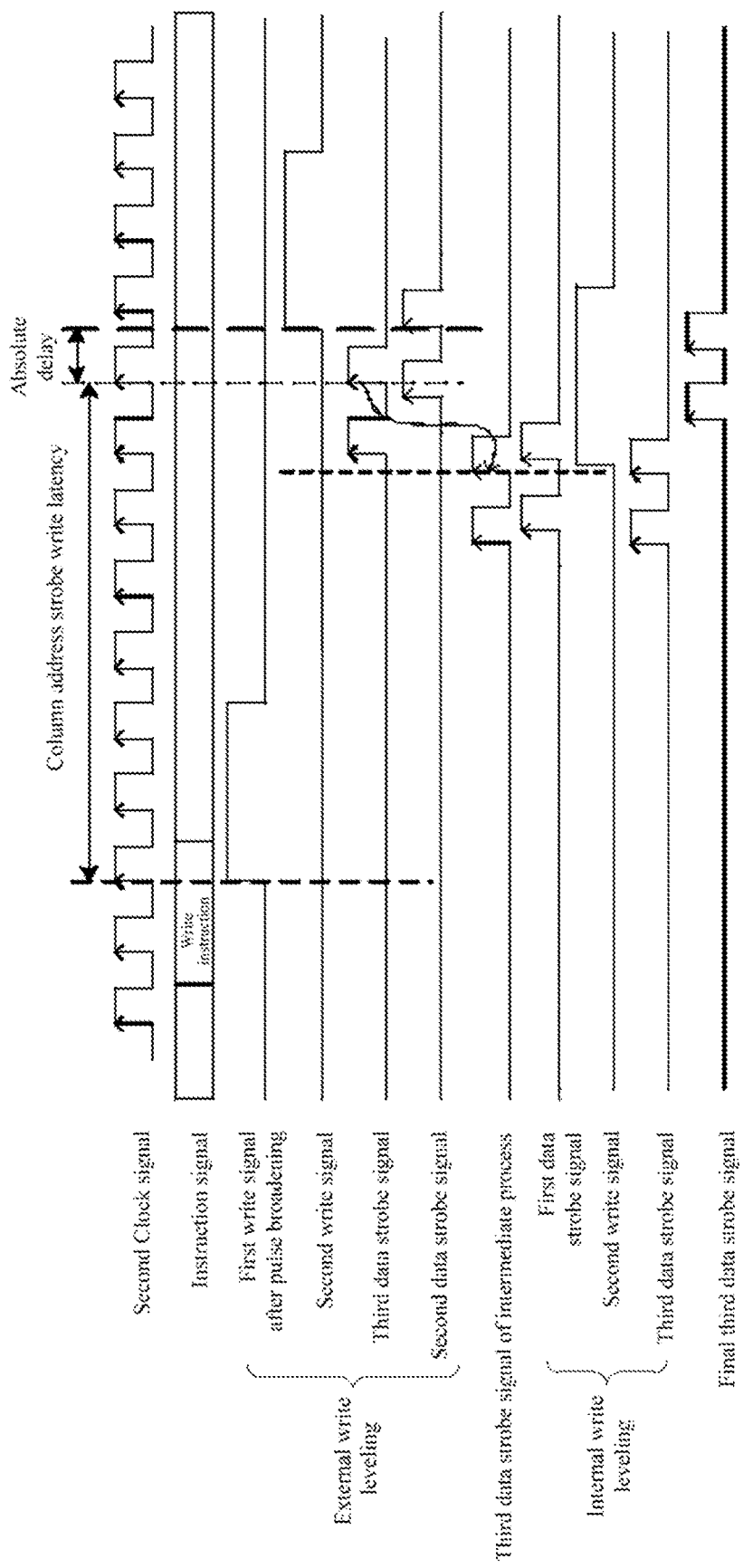
FIG. 9 is a schematic diagram showing changes in signals according to an embodiment of the present disclosure.

FIG. 9 is a schematic diagram showing changes in signals according to an embodiment of the present disclosure. The schematic diagram of changes in signals shown in FIG. 9 is used to indicate changes in data strobe signals and write signals in the process of controlling the write leveling circuit to perform write leveling. In this embodiment, description will be given in conjunction with the write leveling circuit shown in FIG. 6.

As an example, in this embodiment, the second clock signal in FIG. 9 is a clock signal received at the second converter 25 in the write leveling circuit. The corresponding write instruction in the instruction signal is a write instruction received by the decoder 211 in the write leveling circuit in FIG. 6. The decoder 211, upon receiving the write instruction, may generate a first write signal, and send the first write signal to a signal conversion circuit 213 connected to the decoder 211, and the signal conversion circuit 213 performs pulse broadening on the received first write signal to obtain a first write signal after pulse broadening (i.e., the first write signal after pulse broadening in FIG. 9). The signal conversion circuit 213 sends the first write signal after pulse broadening to a first delay circuit 212 connected to the signal conversion circuit 213, and the first delay circuit 212 performs delay processing on the first write signal after pulse broadening to obtain a second write signal (i.e., a second write signal in an external write leveling stage in FIG. 9), and then the second write signal is input to a first flip-flop 231 and a second flip-flop 232 connected to the first delay circuit 212 respectively. Moreover, it can be seen from the figure that in the external write leveling process, the delay between the first write signal after pulse broadening and the second write signal is the sum of the CWL and an absolute delay, where the absolute delay is a delay caused by signal transmission.

Further, the third data strobe signal in the external write leveling process in FIG. 9 is a data strobe signal received by the first converter 24 in the write leveling circuit at the end of the external write leveling process. The second data strobe signal in the external write leveling process in FIG. 9 is obtained by the first converter 24 performing level conversion on the third data strobe signal in the external write leveling process and outputting it to the delay circuit 22 connected to the first converter 24, and then the delay circuit 22 performing delay processing on the signal input by the first converter 24 to the delay circuit 22. Thus, in FIG. 9, the delay between the third data strobe signal in the external write leveling process and the second data strobe signal in the external write leveling process is the sum of the delay caused by the delay circuit 22 and the delay caused by the first converter 24. Moreover, it can be seen from the figure that after the external write leveling process ends, in the external write leveling, the active edge of the second write signal (i.e., a rising edge of the second write signal) is aligned with the active edge of the second data strobe signal (i.e., a rising edge of the second data strobe signal).

After the external write leveling ends, the delay of the first data strobe signal may be reduced by the first preset period. Since the first data strobe signal is obtained by the first converter 24 in the write leveling circuit performing level conversion based on the received third data strobe signal, the delay between the first data strobe signal and the third data strobe signal is a fixed delay caused by the first converter, and reducing the delay of the first data strobe signal by the first preset period accordingly requires reducing the delay of the third data strobe signal by the first preset period. That is, after the third data strobe signal in external write leveling is moved forward by the first preset period, the third data strobe signal in the intermediate process in FIG. 9 is obtained, and the third data strobe signal in the intermediate process is used as a third data strobe signal initially received by the first converter 24 in the internal write leveling of the write leveling process.

The second write signal in the internal write leveling process in FIG. 9 is a signal output by the write signal generation circuit 21 in the write leveling circuit at the end of the internal write leveling process. The first data strobe signal in the internal write leveling process is a signal generated by the third data strobe signal in the intermediate process in the figure after passing through the first converter 24. As can be seen from the figure, in the internal write leveling process, the second write signal output by the write signal generation circuit 21 is moved forward as compared to the second write signal in the external write leveling process, that is, the delay will be reduced. Since the second write signal can only be moved forward by an integer multiple of the clock cycle, the active edge (i.e., rising edge) of the second write signal in the internal write leveling process may be in front of the active edge (i.e., rising edge) of the first data strobe signal in the internal write leveling process as shown in the figure. Therefore, in the internal write leveling process, it is also necessary to move forward the first data strobe signal output by the first converter 24, so that the active edge of the first data strobe signal may be aligned with that of the second write signal.

In FIG. 9, the third data strobe signal in the internal write leveling process is a signal input to the first converter 24 when the active edge of the first data strobe signal is aligned with that of the second write signal in the internal write leveling process. Then, the third data strobe signal is moved backward by a second preset period to obtain a final third data strobe signal in FIG. 9. Thereafter, when a write operation is performed on the memory, the final third data strobe signal determined in the write leveling process may be used as a data strobe signal sent by the controller to a pin of the memory, so that data can be accurately written into the memory.

Figure 10:
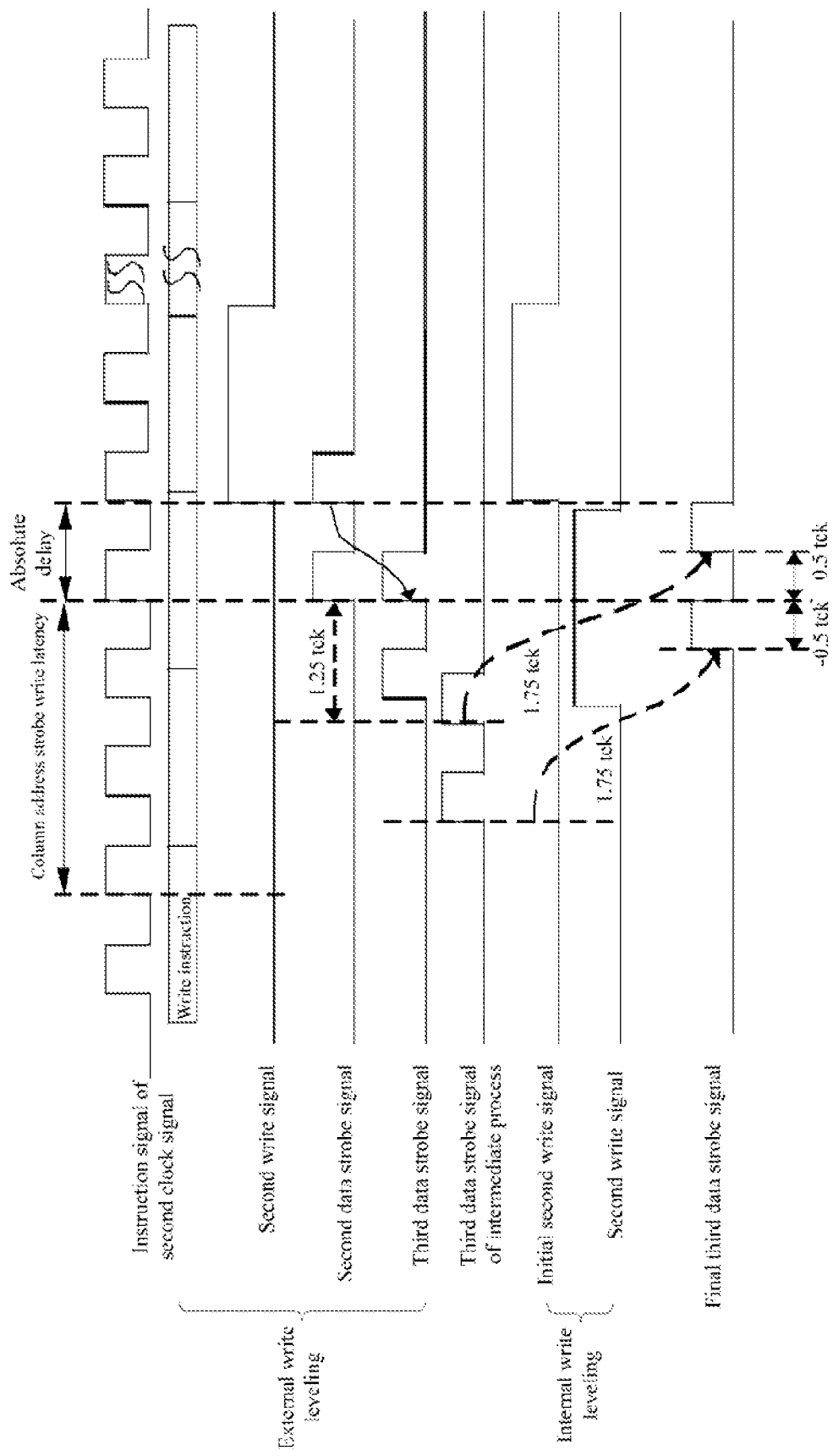
FIG. 10 is another schematic diagram showing changes in signals according to an embodiment of the present disclosure.

FIG. 10 is another schematic diagram showing changes in signals according to an embodiment of the present disclosure. The schematic diagram of changes in signals shown in FIG. 10 is used to indicate changes in data strobe signals and write signals in the process of controlling the write leveling circuit to perform write leveling. In this embodiment, description will be given in conjunction with the write leveling circuit shown in FIG. 6.

As an example, in this embodiment, the second clock signal in FIG. 10 is a clock signal received at the second converter 25 in the write leveling circuit. The corresponding write instruction in the instruction signal is a write instruction received by the decoder 211 in the write leveling circuit in FIG. 6.

In the figure, the second write signal and the second data strobe signal in the external write leveling process are signals output by the write signal generation circuit 21 and the delay circuit 22 respectively at the end of external write leveling. The third data strobe signal in the external write leveling process in the figure is a data strobe signal received by the first converter 24 at the end of the external write leveling process. After the external write leveling process ends, it is necessary to move forward the first data strobe signal output by the first converter 24 by the first preset period. Since the delay between the third data strobe signal input to the first converter 24 and the first data strobe signal output by the first converter 24 is fixed, moving forward the first data strobe signal by the first preset period is equivalent to moving forward the third data strobe signal input to the first converter 24 by the first preset period (i.e., 1.25 tck in the figure), so that the third data strobe signal in the intermediate process in the figure is obtained.

In the internal write leveling process, the second write signal (i.e., the initial second write signal in the internal write leveling process in the figure) output by the write signal generation circuit 21 at the end of the external write leveling process may be moved forward, and the delay of the third data strobe signal input to the first converter 24 also needs to be adjusted, so that the active edge of the second write signal output by the write signal generation circuit 21 is aligned with that of the first data strobe signal output by the first converter 24.

In the figure, if it is determined after the initial second write signal is moved that the active edge of the second write signal output by the write signal generation circuit 21 is aligned with that of the first data strobe signal output by the first converter 24, then the delay of the data strobe signal (i.e., the data strobe signal of the intermediate process in the figure) input to the first converter 24 does not need to be adjusted at the time.

After the internal write leveling process ends, the third data strobe signal input to the first converter 24 at the end of the process, i.e., the third data strobe signal in the intermediate process in the figure, is moved backward by a second preset period (i.e., 1.75 tck in the figure) to obtain a final third data strobe signal. In the figure, the two rising edges in the final third data strobe signal, i.e., the edges of the signal indicated by two dashed arrows in the figure, are shown in the final third data strobe signal in the figure. It can be seen from the figure that the delays between the two rising edges and the active edge (i.e., rising edge) of the second clock signal are −0.5 tck and 0.5 tck respectively. The time differences meet time differences required by the specifications of the memory (e.g., the time difference may be a tDQSoffest parameter required by the memory in the actual application). Accordingly, for subsequent transmission of data to be written to the memory, the data to be written may be sent to the memory based on the time corresponding to either of the two rising edges of the final third data strobe signal shown in the figure.

Figure 11:
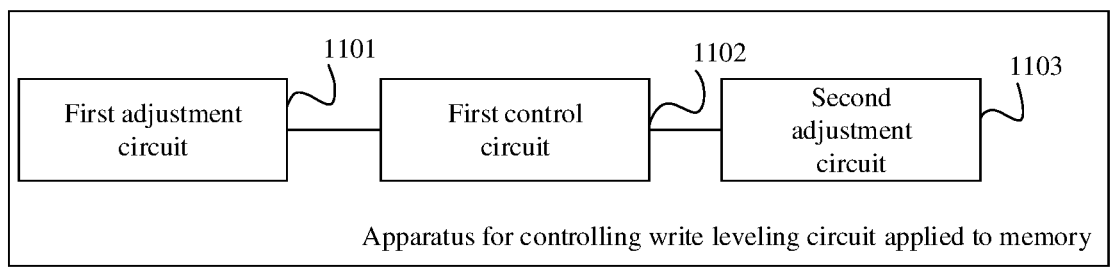
FIG. 11 is a structural schematic diagram of an apparatus for controlling a write leveling circuit applied to a memory according to the present disclosure.

FIG. 11 is a structural schematic diagram of an apparatus for controlling a write leveling circuit applied to a memory according to the present disclosure. The apparatus is applied to the circuit provided in any one of the embodiments in FIGS. 2-6, and includes a first adjustment circuit 1101, a first control circuit 1102 and a second adjustment circuit 1103.

The first adjustment circuit 1101 is configured to, when it is determined that the first sampling signal indicates that the active edge of the first clock signal is misaligned with that of the first data strobe signal, adjust the delay of the first data strobe signal, and repeatedly run the first adjustment circuit until the first adjustment circuit determines, based on the first sampling signal output by the sampling circuit, that the active edge of the first data strobe signal is aligned with that of the first clock signal.

The first control circuit 1102 is configured to, when it is determined that the first sampling signal indicates that the first clock signal is aligned with the first data strobe signal, control the delay of the first data strobe signal to be reduced by a first preset period, and use the signal with the reduced delay as a first data strobe signal currently received by the sampling circuit.

The second adjustment circuit 1103 is configured to, when it is determined that the second sampling signal indicates that the active edge of the first data strobe signal is misaligned with that of the second write signal, adjust the delay of the first data strobe signal or the delay of the first write signal, and repeatedly run the second adjustment circuit until the second adjustment circuit determines, based on the second sampling signal output by the sampling circuit, that the active edge of the first data strobe signal is aligned with that of the second write signal.

The apparatus provided in this embodiment is used to implement the technical solution provided by the method described above, and the implementation principle and the technical effect are similar to the latter and will not be described herein again.

Figure 12:
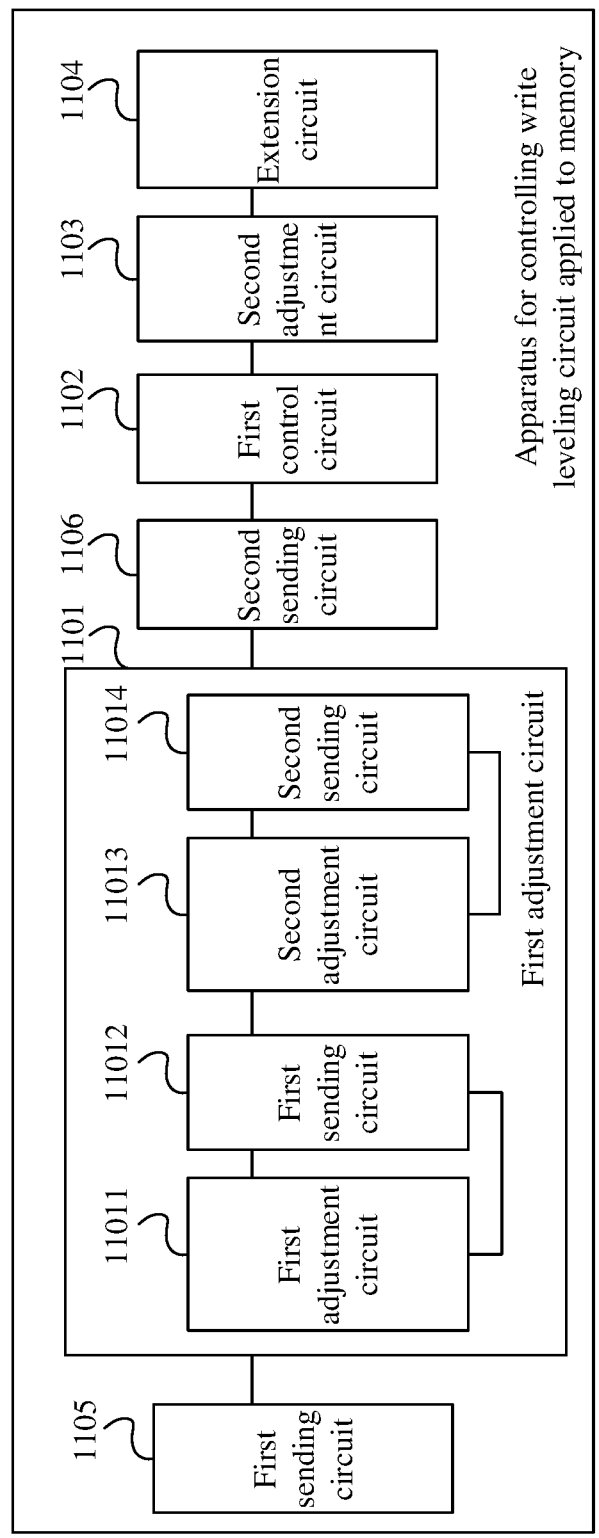
FIG. 12 is a structural schematic diagram of another apparatus for controlling a write leveling circuit applied to a memory according to the present disclosure.

FIG. 12 is a structural schematic diagram of another apparatus for controlling a write leveling circuit applied to a memory according to the present disclosure, the apparatus further includes an extension circuit 1104.

The extension circuit 1104 is configured to, when it is determined that the active edge of the first data strobe signal is aligned with that of the second write signal, extend the delay of the first data strobe signal by a second preset period, and to determine the signal with the extended delay to be a data strobe signal received by the memory during a write operation.

In some embodiments, when it is determined, based on the first sampling signal output by the sampling circuit, that the active edge of the first data strobe signal is aligned with that of the first clock signal, the first adjustment circuit 1101 is specifically configured to, when the level value of the first sampling signal output by the sampling circuit changes from the first level value to the second level value, determine that the active edge of the first data strobe signal is aligned with that of the first clock signal.

In some embodiments, when it is determined, based on the second sampling signal output by the sampling circuit, that the active edge of the first data strobe signal is aligned with that of the second write signal, the second adjustment circuit 1103 is specifically configured to, when the level value of the second sampling signal output by the sampling circuit changes from the second level value to the first level value, determine that the active edge of the first data strobe signal is aligned with that of the second write signal.

In some embodiments, the write signal generation circuit includes a decoder and a first delay circuit. The decoder is configured to decode a received write instruction, and output a first write signal. The first delay circuit is connected to the decoder and configured to perform delay processing on the first write signal based on a received first clock signal to output a second write signal. The first delay circuit is specifically configured to perform delay processing on the first write signal based on the received first clock signal, the CWL of the memory and a first indication signal, and output the second write signal, where the first indication signal is used to indicate a reduced time of the CWL of the memory.

The first adjustment circuit 1101 includes a first adjustment circuit 11011, a first sending circuit 11012, a second adjustment circuit 11013, and a second sending circuit 11014.

The first adjustment circuit 11011 is configured to, when it is determined that the level value of the second sampling signal output by the sampling circuit is the first level value, adjust a first indication signal received by the first delay circuit to increase the reduced time of the CWL of the memory indicated by the first indication signal.

The first sending circuit 11012 is configured to issue a write instruction to the decoder and to issue the adjusted first indication signal to the first delay circuit.

The first adjustment circuit 11011 and the first sending circuit 11012 are run repeatedly until the level value of the second sampling signal output by the sampling circuit is switched from the first level value to the second level value.

The second adjustment circuit 11013 is configured to reduce the delay of the first data strobe signal received by the sampling circuit.

The second sending circuit 11014 is configured to issue a write instruction to the decoder and issue a delay signal to the first delay circuit. The delay signal is a first indication signal received by the first delay circuit when the level value of the second sampling signal output by the sampling circuit is switched from the first level value to the second level value.

The second adjustment circuit 11013 and the second sending circuit 11014 are run repeatedly until the level value of the second sampling signal output by the sampling circuit is switched from the second level value to the first level value.

In some embodiments, the sampling circuit includes a first flip-flop, a second flip-flop and a multiplexer. A data terminal of the first flip-flop is connected to the write signal generation circuit and configured to receive the second write signal output by the write signal generation circuit. A clock terminal of the first flip-flop is connected to an output terminal of the delay circuit and configured to receive the second data strobe signal output by the delay circuit. The first flip-flop is configured to output the first sampling signal based on the second write signal and the second data strobe signal. The data terminal of the second flip-flop is connected to the write signal generation circuit and configured to receive the second write signal output by the write signal generation circuit. A clock terminal of the second flip-flop is configured to receive the first data strobe signal. The second flip-flop is configured to output the second sampling signal based on the second write signal and the first data strobe signal. An output terminal of the first flip-flop is connected to a first terminal of the multiplexer, and an output terminal of the second flip-flop is connected to a second terminal of the multiplexer.

The apparatus further includes: a first sending circuit 1105 and a second sending circuit 1106. The first sending circuit 1105 is configured to, when the first adjustment circuit 1101 has determined that the first sampling signal indicates that the active edge of the first clock signal is misaligned with that of the first data strobe signal, send a first control signal to the multiplexer before adjusting the delay of the first data strobe signal, where the first control signal is used to instruct the multiplexer to output the first sampling signal.

The second sending circuit 1106 is configured to, after the first adjustment circuit 1101 determines, based on the first sampling signal output by the sampling circuit, that the active edge of the first data strobe signal is aligned with that of the first clock signal, send a second control signal to the multiplexer, where the second control signal is used to instruct the multiplexer to output the second sampling signal.

The apparatus provided in this embodiment is used to implement the technical solution provided by the method described above, and the implementation principle and the technical effect are similar to the latter and will not be described herein again.

The present disclosure provides a memory including the write leveling circuit according to any one of embodiments in FIGS. 2-6.

The present disclosure provides an electronic device including a processor and a memory in communication connection with the processor, where the memory stores computer-executable instructions; and the processor executes the computer-executable instructions stored in the memory to implement the method provided in any one of the embodiments in FIG. 7 or FIG. 8.

Figure 13:
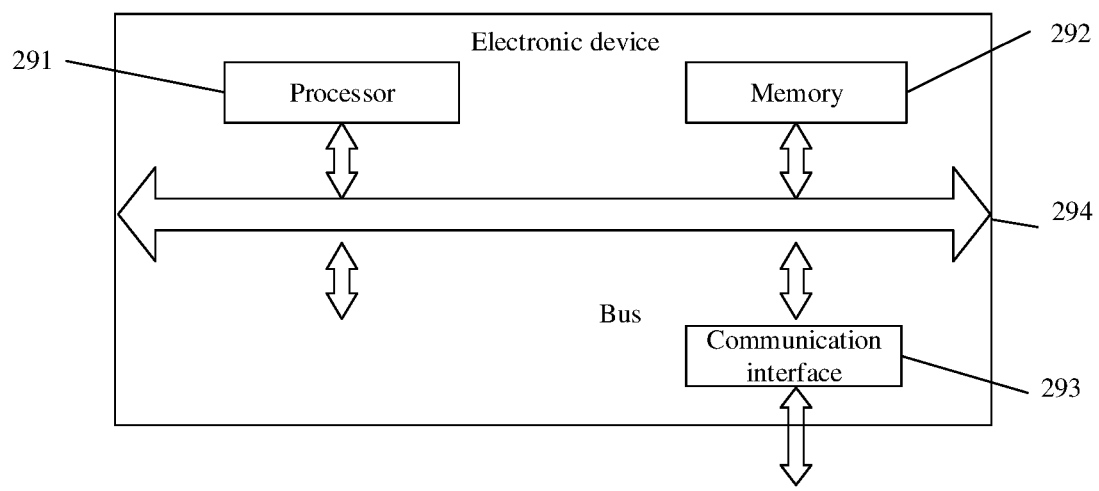
FIG. 13 is a structural schematic diagram of an electronic device according to an embodiment of the present disclosure.

FIG. 13 is a structural schematic diagram of an electronic device according to an embodiment of the present disclosure. As shown in FIG. 13, the electronic device includes a processor 291.

The electronic device also includes a memory 292; the electronic device may also include a communication interface 293 and a bus 294. The processor 291, the memory 292 and the communication interface 293 may communicate with each other via the bus 294. The communication interface 293 may be used for information transmission. The processor 291 may invoke logic instructions in the memory 292 to perform the method in the embodiments described above.

Further, the logic instructions in the memory 292, when implemented in the form of software functional circuits and sold or used as stand-alone products, may be stored in a computer-readable storage medium.

The memory 292 as a computer-readable storage medium may be used to store software programs, computer executable programs, and program instructions/modules corresponding to the method in the embodiments of the present disclosure. The processor 291, by running software programs, instructions and modules stored in the memory 292, implements functional applications and data processing, i.e., implements the method in the above method embodiments.

The memory 292 may include a program storage area and a data storage area. The program storage area may store an operating system and at least one application required for the functions. The data storage area may store data and the like created according to the use of terminal devices. Further, the memory 292 may include a high-speed random access memory, and may also include a non-volatile memory.

The present disclosure provides a computer-readable storage medium having computer-executable instructions stored therein, where the computer-executable instructions, when executed by a processor, are configured to implement the method according to any one of the embodiments as shown in FIG. 7 or FIG. 8.

The present disclosure provides a computer program product including a computer program that is configured to, when executed by a processor, implement the method according to any one of the embodiments as shown in FIG. 7 or FIG. 8.

The present disclosure provides a write leveling circuit applied to a memory, and a method and an apparatus for controlling the same. The write leveling circuit includes: a write signal generation circuit configured to perform delay processing on a first write signal according to a received first clock signal, and output a second write signal; a delay circuit configured to perform delay processing on a received first data strobe signal, and output a second data strobe signal; and a sampling circuit connected to both the delay circuit and the write signal generation circuit and configured to receive the second data strobe signal output by the delay circuit and the second write signal output by the write signal generation circuit, and output a first sampling signal according to the second data strobe signal and the second write signal; the sampling circuit is further configured to receive the first data strobe signal and the second write signal output by the write signal generation circuit, and output a second sampling signal according to the first data strobe signal and the second write signal. In this way, a corresponding controller outside a memory can adjust, by means of the first sampling signal and the second sampling signal output by the sampling circuit in the write leveling circuit, signals sent to the memory by the controller, such that the time difference between an active edge of a data strobe signal received by the memory and an active edge of a clock signal satisfies specification requirements of the memory, thereby enabling data to be written into the memory correctly.

Those skilled in the art could easily conceive of other embodiments of the present disclosure from consideration of the description and practice of the present application disclosed herein. The present disclosure is intended to cover any variations, uses or adaptive changes of the present disclosure, and these variations, uses or adaptive changes follow the general principles of the present disclosure and include common general knowledge or conventional technical means in the art, which are not disclosed in the present disclosure. The description and the embodiments are to be considered as exemplary only, and the true scope and spirit of the present disclosure are indicated by the following claims.

It will be appreciated that the present disclosure is not limited to the exact constructions that have been described above and illustrated in the drawings, and that various modifications and changes may be made without departing from the scope thereof. The scope of the present disclosure is limited only by the appended claims.

Those skilled in the art could easily conceive of other embodiments of the present disclosure from consideration of the description and practice of the present application disclosed herein. The present disclosure is intended to cover any variations, uses or adaptive changes of the present disclosure, and these variations, uses or adaptive changes follow the general principles of the present disclosure and include common general knowledge or conventional technical means in the art, which are not disclosed in the present disclosure. The description and the embodiments are to be considered as exemplary only, and the true scope and spirit of the present disclosure are indicated by the following claims.

It will be appreciated that the present disclosure is not limited to the exact constructions that have been described above and illustrated in the drawings, and that various modifications and changes may be made without departing from the scope thereof.

The invention claimed is:

1. A write leveling circuit applied to a memory, comprising:
a write signal generation circuit, configured to perform delay processing on a first write signal according to a received first clock signal, and output a second write signal;
a delay circuit, configured to perform delay processing on a received first data strobe signal, and output a second data strobe signal; and
a sampling circuit, connected to both the delay circuit and the write signal generation circuit, and configured to receive the second data strobe signal output by the delay circuit and the second write signal output by the write signal generation circuit, and output a first sampling signal according to the second data strobe signal and the second write signal, wherein the sampling circuit is further configured to receive the first data strobe signal and the second write signal output by the write signal generation circuit, and output a second sampling signal according to the first data strobe signal and the second write signal.

2. The write leveling circuit of claim 1, wherein the write signal generation circuit comprises:
a decoder, configured to decode a received write instruction, and output the first write signal; and
a first delay circuit connected to the decoder, and configured to perform delay processing on the first write signal based on the received first clock signal, and output the second write signal.

3. The write leveling circuit of claim 2, wherein the first delay circuit is specifically configured to:
perform delay processing on the first write signal based on the received first clock signal, a column address strobe write latency of the memory and a first indication signal, and output the second write signal, wherein the first indication signal is used to indicate a reduced time of the column address strobe write latency of the memory.

4. The write leveling circuit of claim 2, wherein the write signal generation circuit further comprises: a signal conversion circuit, the decoder is connected to the first delay circuit via the signal conversion circuit, and
the signal conversion circuit is configured to perform pulse broadening on the first write signal output by the decoder, and output a broadened write signal to the first delay circuit.

5. The write leveling circuit of claim 1, wherein the sampling circuit comprises a first flip-flop, a second flip-flop and a multiplexer,
a data terminal of the first flip-flop is connected to the write signal generation circuit and configured to receive the second write signal output by the write signal generation circuit, a clock terminal of the first flip-flop is connected to an output terminal of the delay circuit and configured to receive the second data strobe signal output by the delay circuit, and the first flip-flop is configured to output the first sampling signal based on the second write signal and the second data strobe signal;
a data terminal of the second flip-flop is connected to the write signal generation circuit and configured to receive the second write signal output by the write signal generation circuit, a clock terminal of the second flip-flop is configured to receive the first data strobe signal, and the second flip-flop is configured to output the second sampling signal based on the second write signal and the first data strobe signal; and
an output terminal of the first flip-flop is connected to a first terminal of the multiplexer, and an output terminal of the second flip-flop is connected to a second terminal of the multiplexer.

6. The write leveling circuit of claim 1, wherein the write leveling circuit further comprises:

a first converter, connected to both the delay circuit and the sampling circuit, and configured to perform logic level conversion on a received third data strobe signal to obtain the first data strobe signal, wherein a level of the third data strobe signal is a current model logic level; and a level of the first data strobe signal is a complementary metal oxide semiconductor (CMOS) level.

7. The write leveling circuit of claim 1, wherein the write leveling circuit further comprises:
a second converter, connected to the write signal generation circuit and configured to perform logic level conversion on a received second clock signal to obtain the first clock signal, wherein a level of the second clock signal is a current model logic level, and a level of the first clock signal is a complementary metal oxide semiconductor (CMOS) level.

8. The write leveling circuit of claim 1, wherein the first sampling signal indicates whether an active edge of the first clock signal is aligned with that of the first data strobe signal.

9. The write leveling circuit of claim 8, wherein the first sampling signal is specifically used to instruct an adjustment of a delay of the first data strobe signal when the first sampling signal indicates that an active edge of the first clock signal is misaligned with that of the first data strobe signal.

10. The write leveling circuit of claim 1, wherein the second sampling signal indicates whether an active edge of the first data strobe signal is aligned with that of the second write signal.

11. The write leveling circuit of claim 10, wherein the second sampling signal is specifically used to instruct an adjustment of a delay of the first write signal or a delay of the first data strobe signal when the first sampling signal indicates that the active edge of the first clock signal is aligned with that of the first data strobe signal and the active edge of the first data strobe signal is misaligned with that of the second write signal.

12. A method for controlling the write leveling circuit of claim 1, and comprising:
repeating the following operations until it is determined, based on the first sampling signal output by the sampling circuit, that an active edge of the first data strobe signal is aligned with that of the first clock signal: if it is determined that the first sampling signal indicates that the active edge of the first clock signal is misaligned with that of the first data strobe signal, adjusting a delay of the first data strobe signal;
if it is determined that the first sampling signal indicates that the active edge of the first clock signal is aligned with that of the first data strobe signal, controlling a delay of the first data strobe signal to be reduced by a first preset period, and using a signal with the reduced delay as a first data strobe signal currently received by the sampling circuit; and
repeating the following operations until it is determined, based on the second sampling signal output by the sampling circuit, that the active edge of the first data strobe signal is aligned with that of the second write signal: if it is determined that the second sampling signal indicates that the active edge of the first data strobe signal is misaligned with that of the second write signal, adjusting the delay of the first data strobe signal or a delay of the first write signal.

13. The method of claim 12, further comprising:
when the active edge of the first data strobe signal is aligned with that of the second write signal, extending the delay of the first data strobe signal by a second preset period, and determining a signal with the extended delay to be a data strobe signal received by the memory during a write operation.

14. The method of claim 12, wherein the determining, based on the first sampling signal output by the sampling circuit, that the active edge of the first data strobe signal is aligned with that of the first clock signal comprises:
when a level value of the first sampling signal output by the sampling circuit changes from a first level value to a second level value, determining that the active edge of the first data strobe signal is aligned with that of the first clock signal.

15. The method of claim 14, wherein the determining, based on the second sampling signal output by the sampling circuit, that the active edge of the first data strobe signal is aligned with that of the second write signal comprises:
when a level value of the second sampling signal output by the sampling circuit changes from a second level value to a first level value, determining that the active edge of the first data strobe signal is aligned with that of the second write signal.

16. The method of claim 15, wherein the write signal generation circuit comprises: a decoder configured to decode a received write instruction, and output the first write signal; and a first delay circuit connected to the decoder, and configured to perform delay processing on the first write signal based on a received first clock signal to output the second write signal; the first delay circuit is specifically configured to perform delay processing on the first write signal based on the received first clock signal, a column address strobe write latency of the memory and a first indication signal, and output the second write signal, wherein the first indication signal is used to indicate a reduced time of the column address strobe write latency of the memory;
the repeating the following operations until it is determined, based on the second sampling signal output by the sampling circuit, that the active edge of the first data strobe signal is aligned with that of the second write signal: if it is determined that the second sampling signal indicates that the active edge of the first data strobe signal is misaligned with that of the second write signal, adjusting the delay of the first data strobe signal or the delay of the first write signal comprises:
repeating the flowing operations until a level value of the second sampling signal output by the sampling circuit is switched from a first level value to a second level value: if it is determined that the level value of the second sampling signal output by the sampling circuit is the first level value, adjusting a first indication signal received by the first delay circuit to increase the reduced time of the column address strobe write latency of the memory indicated by the first indication signal; and issuing a write instruction to the decoder, and issuing the adjusted first indication signal to the first delay circuit; and
repeating the following operations until the level value of the second sampling signal output by the sampling circuit is switched from the second level value to the first level value: reducing the delay of the first data strobe signal received by the sampling circuit, and issuing a write instruction to the decoder, and issuing a delay signal to the first delay circuit, wherein the delay signal is a first indication signal received by the first delay circuit when the level value of the second sampling signal output by the sampling circuit is switched from the first level value to the second level value.

17. The method of claim 12, wherein the sampling circuit comprises: a first flip-flop, a second flip-flop and a multiplexer; a data terminal of the first flip-flop is connected to the write signal generation circuit and configured to receive the second write signal output by the write signal generation circuit; a clock terminal of the first flip-flop is connected to an output terminal of the delay circuit and configured to receive the second data strobe signal output by the delay circuit; the first flip-flop is configured to output the first sampling signal based on the second write signal and the second data strobe signal; a data terminal of the second flip-flop is connected to the write signal generation circuit and configured to receive the second write signal output by the write signal generation circuit; a clock terminal of the second flip-flop is configured to receive the first data strobe signal, and the second flip-flop is configured to output the second sampling signal based on the second write signal and the first data strobe signal; and an output terminal of the first flip-flop is connected to a first terminal of the multiplexer, and an output terminal of the second flip-flop is connected to a second terminal of the multiplexer;

if it is determined that the first sampling signal indicates that the active edge of the first clock signal is misaligned with that of the first data strobe signal, then before adjusting the delay of the first data strobe signal, the method further comprises:

sending a first control signal to the multiplexer, the first control signal being used to instruct the multiplexer to output the first sampling signal; and after the determining, based on the first sampling signal output by the sampling circuit, that the active edge of a first data strobe signal is aligned with that of the first clock signal, the method further comprises:

sending a second control signal to the multiplexer, the second control signal being used to instruct the multiplexer to output the second sampling signal.

18. An apparatus for controlling the write leveling circuit of claim 1, and comprising:

a processor;

a memory for storing instructions, wherein the processor is configured to execute the instructions to perform the following operations:

repeating the following operations until it is determined, based on the first sampling signal output by the sampling circuit, that an active edge of the first data strobe signal is aligned with that of the first clock signal: if it is determined that the first sampling signal indicates that the active edge of the first clock signal is misaligned with that of the first data strobe signal, adjusting a delay of the first data strobe signal;

if it is determined that the first sampling signal indicates that the active edge of the first clock signal is aligned with that of the first data strobe signal, controlling a delay of the first data strobe signal to be reduced by a first preset period, and using a signal with the reduced delay as a first data strobe signal currently received by the sampling circuit; and repeating the following operations until it is determined, based on the second sampling signal output by the sampling circuit, that the active edge of the first data strobe signal is aligned with that of the second write signal: if it is determined that the second sampling signal indicates that the active edge of the first data strobe signal is misaligned with that of the second write signal, adjusting the delay of the first data strobe signal or a delay of the first write signal.

19. A memory, comprising a write leveling circuit, wherein the write leveling circuit comprises:

a write signal generation circuit, configured to perform delay processing on a first write signal according to a received first clock signal, and output a second write signal;

a delay circuit, configured to perform delay processing on a received first data strobe signal, and output a second data strobe signal; and a sampling circuit, connected to both the delay circuit and the write signal generation circuit, and configured to receive the second data strobe signal output by the delay circuit and the second write signal output by the write signal generation circuit, and output a first sampling signal according to the second data strobe signal and the second write signal, wherein the sampling circuit is further configured to receive the first data strobe signal and the second write signal output by the write signal generation circuit, and output a second sampling signal according to the first data strobe signal and the second write signal.

20. The memory of claim 19, wherein the write signal generation circuit comprises:

a decoder, configured to decode a received write instruction, and output the first write signal; and a first delay circuit connected to the decoder, and configured to perform delay processing on the first write signal based on the received first clock signal, and output the second write signal.

\* \* \* \* \*